US010836200B2

(12) United States Patent
Willner et al.

(10) Patent No.: US 10,836,200 B2
(45) Date of Patent: Nov. 17, 2020

(54) RIGID MICRO-MODULES WITH ILED AND LIGHT CONDUCTOR

(71) Applicant: X Display Company Technology Limited, Dublin (IE)

(72) Inventors: Mark Willner, Denver, CO (US); Ronald S. Cok, Rochester, NY (US); Robert R. Rotzoll, Colorado Springs, CO (US); Christopher Andrew Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 78 days.

(21) Appl. No.: 16/186,441

(22) Filed: Nov. 9, 2018

(65) Prior Publication Data

US 2019/0143737 A1  May 16, 2019

Related U.S. Application Data

(60) Provisional application No. 62/585,441, filed on Nov. 13, 2017.

(51) Int. Cl.
| | |
|---|---|
| *B42D 25/36* | (2014.01) |
| *H01L 25/16* | (2006.01) |
| *F21V 23/00* | (2015.01) |
| *B42D 25/29* | (2014.01) |
| *B42D 25/355* | (2014.01) |

(Continued)

(52) U.S. Cl.
CPC ............. *B42D 25/36* (2014.10); *B42D 25/29* (2014.10); *B42D 25/305* (2014.10);
(Continued)

(58) Field of Classification Search
CPC ...... B42D 25/36; B42D 25/45; B42D 25/305; B42D 25/355; B42D 25/29; H01L 41/113;
(Continued)

(56) References Cited

U.S. PATENT DOCUMENTS

| 5,394,969 A | 3/1995 | Harbaugh |
| 6,131,718 A | 10/2000 | Witschorik |

(Continued)

OTHER PUBLICATIONS

Bower, C. A. et al., Emissive displays with transfer-printed assemblies of 8 μm×15 μm inorganic light-emitting diodes, Photonics Research, 5(2):A23-A29, (2017).

(Continued)

*Primary Examiner* — Isiaka O Akanbi
*Assistant Examiner* — Glenn D Zimmerman
(74) *Attorney, Agent, or Firm* — William R. Haulbrook; Michael D. Schmitt; Choate, Hall & Stewart LLP

(57) ABSTRACT

A light-emitting module structure comprises a support substrate and a micro-module disposed on or in the support substrate that extends over only a portion of the support substrate. The micro-module comprises a rigid module substrate, an inorganic light-emitting diode, a power source, and a control circuit. The inorganic light-emitting diode, the power source, and the control circuit are disposed on or in the module substrate and the control circuit receives power from the power source to control the inorganic light-emitting diode to emit light. A light conductor is disposed on or in the support substrate and in alignment with the micro-module so that the inorganic light-emitting diode is disposed to emit light into the light conductor and the light conductor conducts the light beyond the micro-module to emit the light from the light conductor.

20 Claims, 15 Drawing Sheets

(51) Int. Cl.

| | | |
|---|---|---|
| *F21V 8/00* | (2006.01) | |
| *B42D 25/305* | (2014.01) | |
| *H01L 41/113* | (2006.01) | |
| *H02N 2/18* | (2006.01) | |
| *B42D 25/45* | (2014.01) | |
| *F21Y 115/10* | (2016.01) | |
| *H01L 41/083* | (2006.01) | |
| *G02B 6/42* | (2006.01) | |

(52) U.S. Cl.
CPC ........... *B42D 25/355* (2014.10); *B42D 25/45* (2014.10); *F21V 23/005* (2013.01); *G02B 6/0005* (2013.01); *G02B 6/005* (2013.01); *G02B 6/0031* (2013.01); *G02B 6/0055* (2013.01); *H01L 25/165* (2013.01); *H01L 25/167* (2013.01); *H01L 41/113* (2013.01); *H02N 2/18* (2013.01); *F21Y 2115/10* (2016.08); *G02B 6/4274* (2013.01); *H01L 41/083* (2013.01)

(58) Field of Classification Search
CPC ... H01L 25/167; H01L 25/165; H01L 41/083; G02B 6/005; G02B 6/0055; G02B 6/0031; G02B 6/0005; G02B 6/4274; G02B 27/48; G02B 19/0052; G02B 27/0911; G02B 27/0927; G02B 5/0257; G02B 5/0215; G02B 19/0014; G02B 27/095; G02B 27/0916; G02B 5/021; G02B 26/0808; G02B 5/0278; G02B 27/0938; G02B 27/0955; H02N 2/18; F21V 23/005; F21Y 2115/10; G01S 7/4814; G01S 17/42; G03B 21/005; G03B 21/142

See application file for complete search history.

(56) References Cited

U.S. PATENT DOCUMENTS

| | | | |
|---|---|---|---|
| 6,142,358 A | 11/2000 | Cohn et al. | |
| 7,195,733 B2 | 3/2007 | Rogers et al. | |
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,710,655 B2 * | 5/2010 | Freeman | G02B 27/1086 359/636 |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 8,115,383 B2 * | 2/2012 | Cok | F21K 9/00 313/506 |
| 8,333,860 B1 | 12/2012 | Bibl et al. | |
| 8,391,688 B2 | 3/2013 | Zhang et al. | |
| 8,470,701 B2 | 6/2013 | Rogers et al. | |
| 8,506,867 B2 | 8/2013 | Menard | |
| 8,558,243 B2 | 10/2013 | Bibl et al. | |
| 8,722,458 B2 | 5/2014 | Rogers et al. | |
| 8,791,474 B1 | 7/2014 | Bibl et al. | |
| 8,791,822 B2 | 7/2014 | Delia et al. | |
| 8,794,501 B2 | 8/2014 | Bibl et al. | |
| 8,835,940 B2 | 9/2014 | Hu et al. | |
| 8,860,051 B2 * | 10/2014 | Fellows | H01L 33/06 257/98 |
| 8,865,489 B2 | 10/2014 | Rogers et al. | |
| 8,877,648 B2 | 11/2014 | Bower et al. | |
| 8,889,485 B2 | 11/2014 | Bower | |
| 8,934,259 B2 | 1/2015 | Bower et al. | |
| 8,941,215 B2 | 1/2015 | Hu et al. | |
| 8,987,765 B2 | 3/2015 | Bibl et al. | |
| 9,049,797 B2 | 6/2015 | Menard et al. | |
| 9,087,764 B2 | 7/2015 | Chan et al. | |
| 9,105,714 B2 | 8/2015 | Hu et al. | |
| 9,111,464 B2 | 8/2015 | Bibl et al. | |
| 9,139,425 B2 | 9/2015 | Vestyck | |
| 9,153,171 B2 | 10/2015 | Sakariya et al. | |
| 9,161,448 B2 | 10/2015 | Menard et al. | |
| 9,165,989 B2 | 10/2015 | Bower et al. | |
| 9,166,114 B2 | 10/2015 | Hu et al. | |
| 9,178,123 B2 | 11/2015 | Sakariya et al. | |
| 9,217,541 B2 | 12/2015 | Bathurst et al. | |
| 9,240,397 B2 | 1/2016 | Bibl et al. | |
| 9,252,375 B2 | 2/2016 | Bibl et al. | |
| 9,355,854 B2 | 5/2016 | Meitl et al. | |
| 9,358,775 B2 | 6/2016 | Bower et al. | |
| 9,367,094 B2 | 6/2016 | Bibl et al. | |
| 9,412,727 B2 | 8/2016 | Menard et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,583,533 B2 | 2/2017 | Hu et al. | |
| 9,589,944 B2 | 3/2017 | Higginson et al. | |
| 9,601,356 B2 | 3/2017 | Bower et al. | |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 10,217,308 B2 | 2/2019 | Rotzoll et al. | |
| 2003/0141570 A1 | 7/2003 | Chen et al. | |
| 2005/0265029 A1* | 12/2005 | Epstein | G09F 9/3026 362/339 |
| 2007/0041067 A1* | 2/2007 | Reinhart | B42D 25/355 359/15 |
| 2007/0210748 A1* | 9/2007 | Unkrich | H02J 7/022 320/114 |
| 2008/0308792 A1* | 12/2008 | Takahashi | G09G 3/3291 257/40 |
| 2010/0176720 A1* | 7/2010 | Yamazaki | H01L 51/56 313/509 |
| 2010/0306993 A1 | 12/2010 | Mayyas et al. | |
| 2011/0211348 A1* | 9/2011 | Kim | H01L 25/0753 362/235 |
| 2013/0207964 A1* | 8/2013 | Fleck | H01L 27/153 345/419 |
| 2013/0309792 A1 | 11/2013 | Tischler et al. | |
| 2013/0316487 A1 | 11/2013 | de Graff et al. | |
| 2014/0159043 A1 | 6/2014 | Sakariya et al. | |
| 2014/0160411 A1* | 6/2014 | Yim | G02F 1/133553 349/113 |
| 2014/0367633 A1* | 12/2014 | Bibl | H01L 25/0753 257/13 |
| 2015/0233558 A1* | 8/2015 | Ticktin | F21V 21/22 362/404 |
| 2015/0371585 A1* | 12/2015 | Bower | H01L 33/385 345/1.1 |
| 2015/0372053 A1 | 12/2015 | Bower et al. | |
| 2016/0093600 A1 | 3/2016 | Bower et al. | |
| 2017/0160445 A1* | 6/2017 | Chiu | G02B 1/04 |
| 2017/0213502 A1* | 7/2017 | Henry | H01L 25/0753 |
| 2017/0246899 A1 | 8/2017 | Cok et al. | |
| 2017/0301282 A1 | 10/2017 | Rotzoll et al. | |
| 2017/0302336 A1 | 10/2017 | Rotzoll et al. | |
| 2017/0307286 A1* | 10/2017 | Thomas | A47F 11/10 |
| 2017/0338374 A1 | 11/2017 | Zou et al. | |
| 2018/0287030 A1* | 10/2018 | Takeya | H01L 27/153 |
| 2019/0049651 A1* | 2/2019 | Yamamoto | G02B 6/0025 |

OTHER PUBLICATIONS

Bower, C. A. et al., Micro-Transfer-Printing: Heterogeneous Integration of Microscale Semiconductor Devises using Elastomer Stamps, IEEE Conference, (2014).

(56) References Cited

OTHER PUBLICATIONS

Bower, C. A. et al., Transfer Printing: An Approach for Massively Parallel Assembly of Microscale Devices, IEEE, Electronic Components and Technology Conference, (2008).
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341, (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

\* cited by examiner

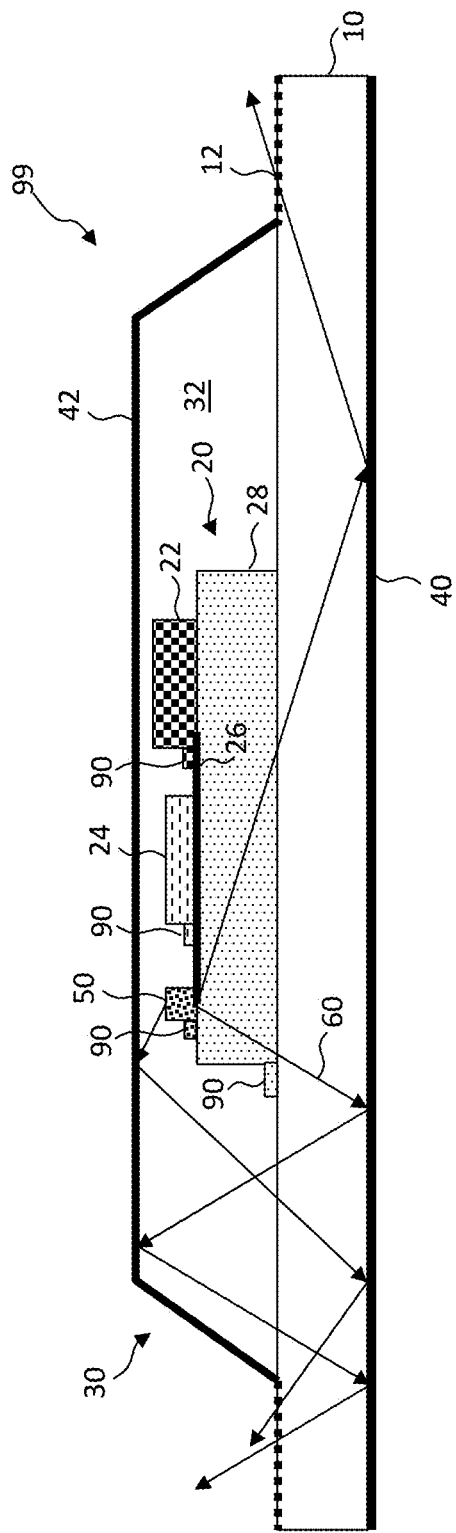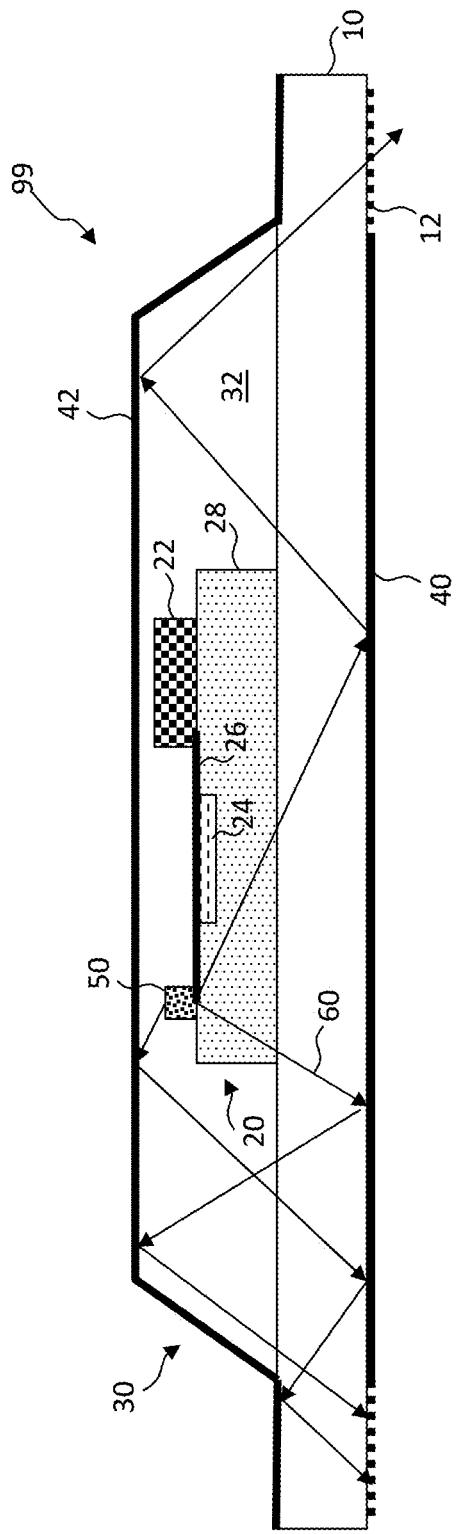
FIG. 1A
FIG. 1B

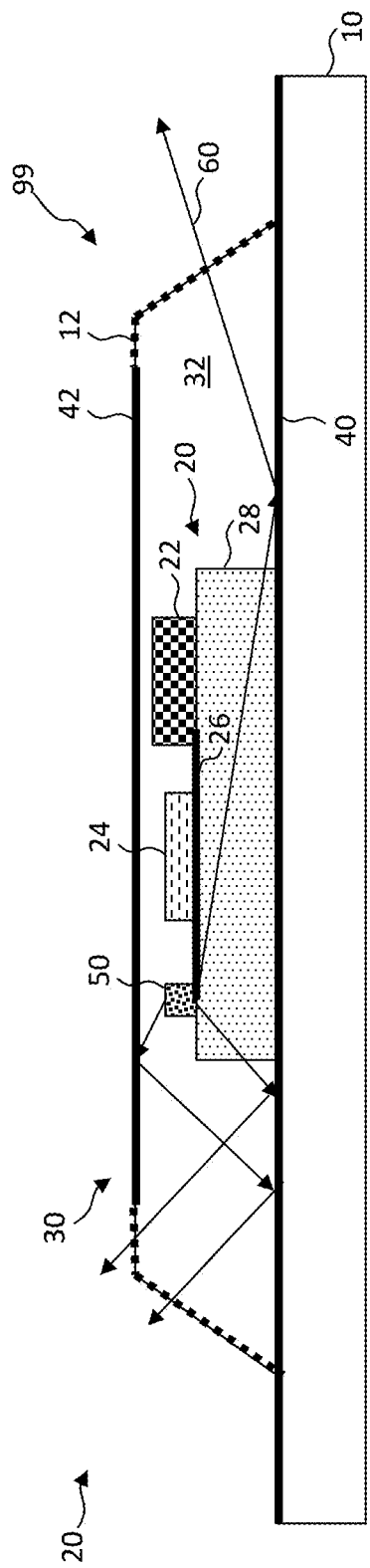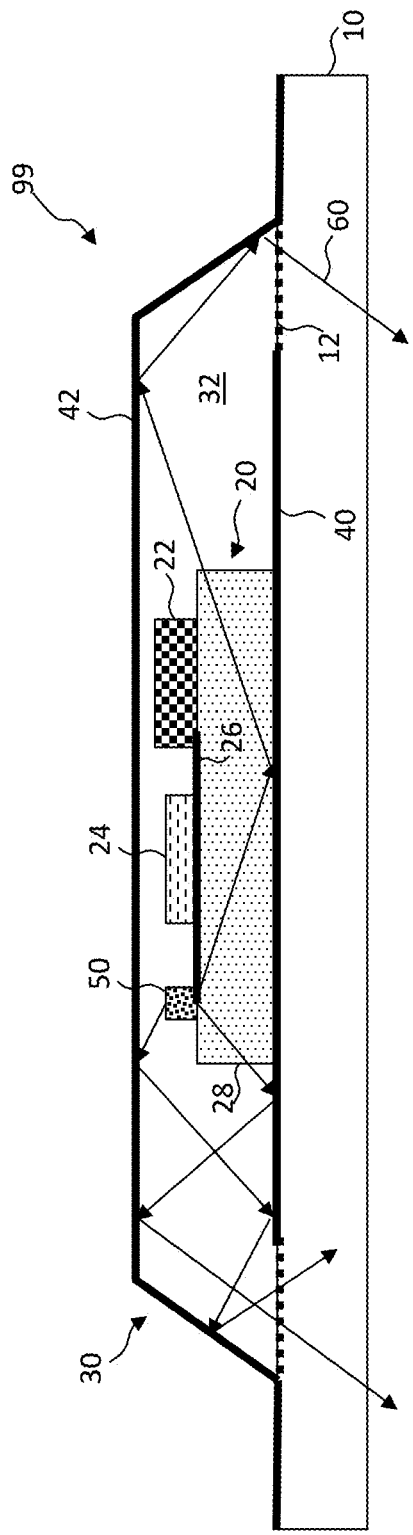
FIG. 2A
FIG. 2B

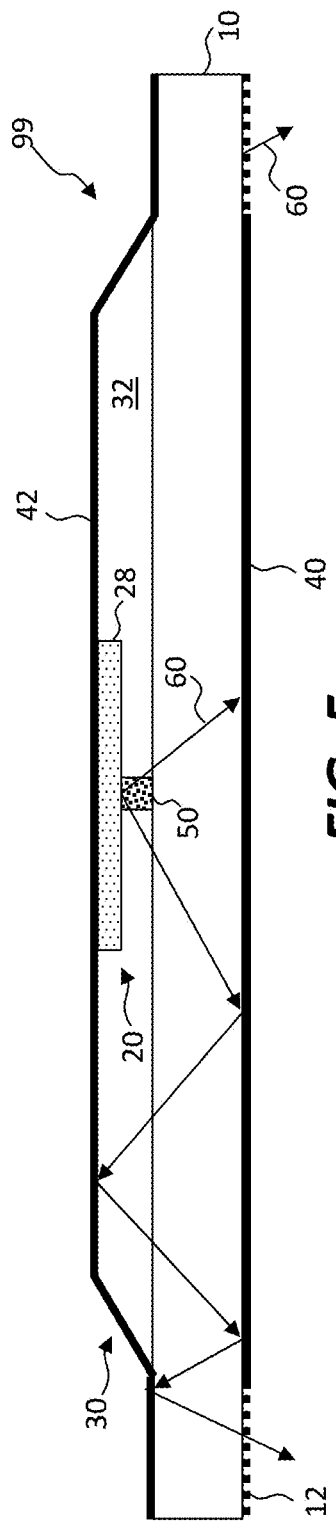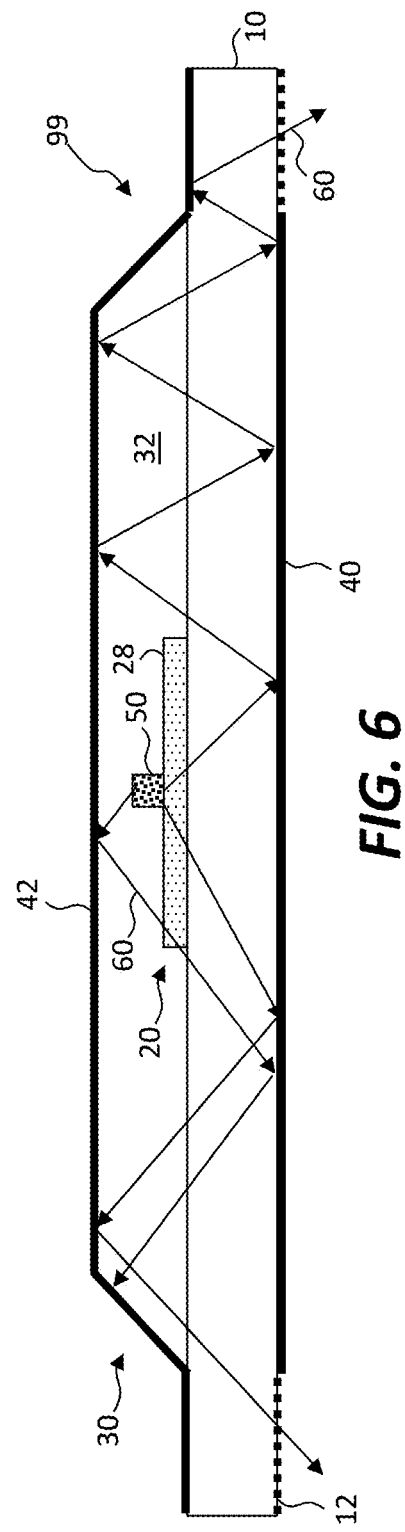

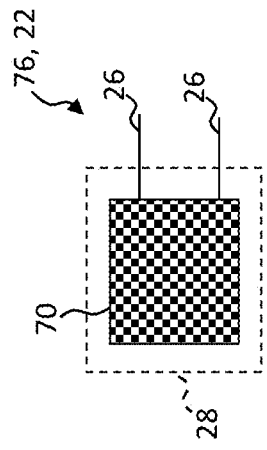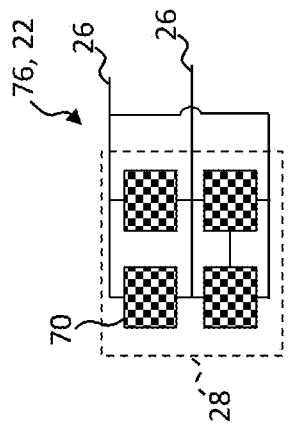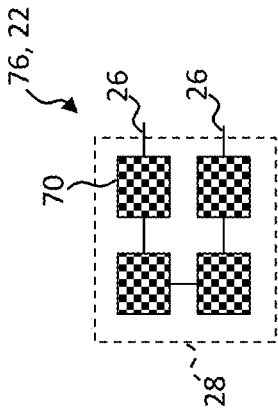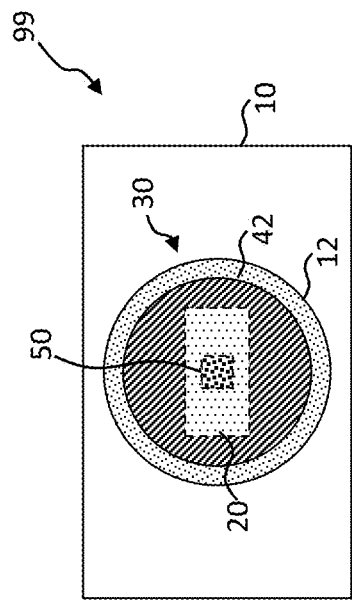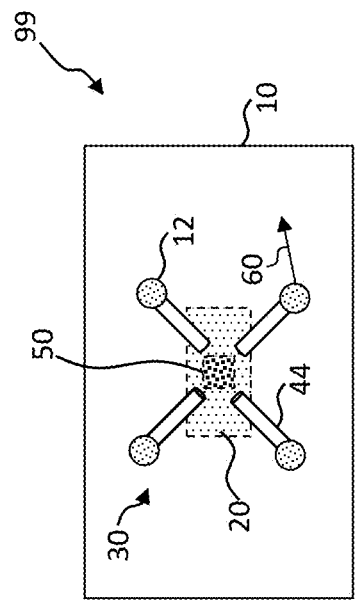

RIGID MICRO-MODULES WITH ILED AND LIGHT CONDUCTOR

PRIORITY APPLICATION

This application claims the benefit of U.S. Provisional Patent Application No. 62/585,441, filed on Nov. 13, 2017, entitled Rigid Micro-Modules with ILED and Light Conductor, the disclosure of which is incorporated by reference herein in its entirety.

CROSS REFERENCE TO RELATED APPLICATIONS

Reference is made to U.S. patent application Ser. No. 15/433,119, filed Feb. 15, 2017, entitled "Hybrid Banknote with Electronic Indicia", U.S. patent application Ser. No. 15/157,838, filed May 18, 2016, entitled Hybrid Banknote with Electronic Indicia Using Near-Field Communications, U.S. patent application Ser. No. 15/452,183, filed Mar. 7, 2017, entitled Wirelessly Powered Display and System, and U.S. patent application Ser. No. 15/678,981, filed Aug. 16, 2017, entitled Hybrid Banknote with Electronic Indicia Using Near-Field Communications, the contents of each of which are hereby incorporated by reference in their entirety.

TECHNICAL FIELD

The present disclosure relates generally to micro-modules capable of emitting light [e.g., for use with documents such as security or value documents (e.g., banknotes)] and particularly, in some embodiments, to flexible documents having one or more micro-modules comprising electronically controlled inorganic light-emitting diodes powered by piezo-electric elements disposed thereon.

BACKGROUND

Monetary instruments issued by governments such as money or currency are used throughout the world today. Government-issued currency typically includes banknotes (also known as paper currency or bills) having visible markings printed on high-quality paper, plastic, or paper impregnated or protected with other materials, such as plastic. The visible markings indicate the denomination (monetary value) of the banknote, include a serial number, and incorporate decorations such as images, and anti-counterfeiting structures such as special threads, ribbons, and holograms. Currency circulates within an economic system as a medium of monetary exchange having a fixed value until it is physically worn out. Worn out banknotes are generally returned by banks or other financial institutions and then replaced.

Other privately issued monetary instruments are also used, such as credit cards and gift cards. These cards typically include an electronically accessible value (e.g., stored in a magnetic stripe or in a chip in the card) or indicate an electronically accessible account that can be used to make purchases. However, the value of the card is not readily viewed by a user without special equipment, such as a reader.

In the past, banknotes have not been electronically enabled. However, more recently there have been proposals to use RFID (radio-frequency identification device) in banknotes to validate the banknote and avoid counterfeiting. For example, U.S. Pat. Nos. 8,391,688 and 8,791,822 disclose systems for currency validation. U.S. Pat. No. 5,394, 969 describes a capacitance-based verification device for a security thread embedded within currency paper to defeat counterfeiting. Security systems for scanning a paper banknote and checking identification information in the banknote (e.g., the serial number) with a network-accessible database have been proposed, for example in U.S. Pat. No. 6,131,718. In all of these systems, however, there is no way to visibly test small details of a banknote without using a separate electronic or optical reader.

Security documents, such as government-issued identification documents, for example passports and driver's licenses are also widely used. In recent years, such documents have incorporated electronic devices. However, these documents are typically not subjected to the same degree of environmental and mechanical stress and abuse that banknotes experience.

There remains a need therefore, for value and security documents such as banknotes with electronically controlled, visible indicia that prevent counterfeiting and are accessible (e.g., observable) without using a separate electronic or optical reader.

SUMMARY

Certain embodiments provide a light-emitting module structure that comprises a support substrate and a micro-module disposed on or in the support substrate that extends over only a portion of the support substrate. The micro-module comprises a rigid module substrate, an inorganic light-emitting diode, a power source, and a control circuit. The inorganic light-emitting diode, the power source, and the control circuit are disposed on or in the module substrate and the control circuit receives power from the power source to control the inorganic light-emitting diode to emit light. A light conductor is disposed on or in the support substrate and in alignment with the micro-module so that the inorganic light-emitting diode is disposed to emit light into the light conductor and the light conductor conducts and transmits the light beyond the micro-module to emit the light from the light conductor. The micro-module can comprise an electrical interconnection circuit that electrically interconnects the power source, the control circuit, and the inorganic light-emitting diode.

In some embodiments, the module substrate is a semiconductor substrate and the control circuit is formed at least partially in or on the module substrate. In some embodiments, the control circuit can be a micro-transfer printed integrated circuit having a circuit substrate separate (e.g., distinct and independent) from the module substrate and support substrate and at least a portion of a fractured or separated tether. The inorganic light-emitting diode can be a micro-transfer printed inorganic light-emitting diode (iLED) having an iLED substrate separate (e.g., distinct and independent) from the module and support substrates and at least a portion of a fractured or separated tether. Similarly, the power source can be a micro-transfer printed power source having a power source substrate separate (e.g., distinct and independent) from the module and support substrates and at least a portion of a fractured or separated tether. Any one or all of the inorganic light-emitting diode, the power source, and the control circuit can be micro-transfer printed on the module substrate.

In certain embodiments, the power source comprises a solar cell responsive to light, a piezo-electric structure responsive to mechanical pressure, or an antenna responsive to electromagnetic radiation such as radio waves. The piezoelectric structure can comprise a stack of piezo-electric elements electrically connected in serial.

In certain embodiments, the light conductor comprises one or more reflectors and a transparent layer adjacent to the reflector in a direction orthogonal to the support substrate or disposed between two reflectors. A reflector can be disposed on the support substrate between the support substrate and the micro-module, a reflector can be disposed on the support substrate so that the support substrate is between the reflector and the micro-module, or the micro-module can be disposed between the support substrate and a reflector. In some embodiments, the light conductor comprises one or more light pipes, one or more diffusers, light leaks, or one or more optical gaps disposed at least in part beyond the micro-module. The light conductor can extend over only a portion of the support substrate providing optical gaps at the extremity of the light conductor. Optical gaps are locations in the light conductor where light can be emitted from the light conductor, for example openings in a reflector where no reflective material is present.

In some embodiments, the inorganic light-emitting diode primarily emits light through the module substrate, the inorganic light-emitting diode primarily emits light in a direction away from the module substrate, the inorganic light-emitting diode is disposed between the module substrate and the support substrate, or the module substrate is disposed between the inorganic light-emitting diode and the support substrate.

In certain embodiments, the support substrate is flexible. In some embodiments, the support substrate is a security strip, that can be disposed on or in a security or value document such as a banknote, for example by lamination or weaving. In some embodiments, the support substrate is a banknote, a security document, or value document, a portion of a security or value document, or a layer on or in a security or value document.

Certain embodiments provide anti-counterfeiting features in value or security documents such as banknotes that can be visibly ascertained without requiring specialized equipment and that are robust in the presence of environmental and mechanical stress. The features can be robust to physical abuse because the electronic portion of the feature is provided on a very small, relatively rigid module substrate and the optical portion of the feature is relatively flexible.

In some embodiments, a piezo-electric power source comprises a stack of piezo-electric elements electrically connected in serial. The stack of piezo-electric elements is responsive to mechanical pressure to produce electrical power. An electrical conductor can be disposed in the stack between at least two of the piezo-electric elements.

The piezo-electric elements can be less than or equal to 500 microns thick, 200 microns thick, 100 microns thick, 50 microns thick, 20 microns thick, 10 microns thick, or 5 microns thick and the stack of piezo-electric elements can be greater than or equal to 100 microns thick, 500 microns thick, one mm thick, two mm thick, four mm thick, five mm thick, or 10 mm thick. The stack of piezo-electric elements can comprise two, three, four, five, ten, twenty, fifty, or one hundred piezo-electric elements. The stack of piezo-electric elements can have an area in a plane orthogonal to the element stack of less than or equal to 100 square mm, 25 square mm, one square mm, 250,000 square microns, 40,000 square microns, 10,000 square microns, 2,500 square microns, 1,000 square microns, 500 square microns, or 100 square microns. In some embodiments, the piezo-electric power source comprises a support substrate or a module substrate and the piezo-electric stack is disposed on the support substrate or the module substrate. The support substrate can be flexible.

A plurality of stacks of piezo-electric elements can be electrically connected serially or in parallel and disposed on a substrate, such as a support or module substrate. Each stack of the plurality of stacks of piezo-electric elements can be spatially separated from every other stack of piezo-electric elements.

In certain embodiments, one or more of the piezo-electric elements is a piezo-electric capacitor. In certain embodiments, a control circuit is electrically connected to the piezo-electric stack for storing the electrical power so that the control circuit stores at least a portion of the electrical power. The control circuit can be electrically connected to the piezo-electric stack for converting the electrical power from one voltage, current, or temporal duration to another different voltage, current, or temporal duration.

In certain embodiments, a temporal duration for applying mechanical pressure to the piezo-electric stack is a press duration, and the control circuit outputs energy for a temporal output duration. The output duration can be temporally delayed from the press duration by at least one msec, the output duration can be less than the press duration, the output duration can be greater than the press duration, or the output duration can be greater than or equal to one msec, or any combination of output, temporal, and press durations.

Methods of making a piezo-electric power source comprise providing a power-source substrate and one or more element wafers. The power-source substrate can be a module substrate or a power-source wafer. Each element wafer comprises one or more piezo-electric elements; each piezo-electric element is disposed over a sacrificial portion separated by anchor portions of the element wafer. One or more piezo-electric elements are released and micro-transfer printed from the one or more element wafers onto or over a piezo-electric element onto the power-source substrate or module substrate to form a stack of piezo-electric elements. In one embodiment, a stack on the power-source substrate can be transferred to the module substrate. In some embodiments, the stack can be disposed over a sacrificial portion separated by anchor portions of the power-source wafer, released from the power-source wafer, and micro-transfer printed to the module substrate.

An electrical conductor can be provided between the piezo-electric elements and the electrical conductor can be heated and cooled to adhere the stacked piezo-electric elements to each other. The electrical conductor can be an electrically conductive interface between two piezo-electric elements in the stack.

Certain embodiments provide a method of operating a piezo-electric device for converting mechanical pressure into electrical power. A piezo-electric power source comprising a control circuit electrically connected to the piezo-electric power source and an output device electrically connected and responsive to the control circuit to output energy are provided. A temporal duration for applying mechanical pressure to the piezo-electric stack is a press duration, the control circuit controls the output device to output energy for a temporal output duration, and the output duration is temporally delayed from the press duration by at least one msec.

An observer has a pressing device (such as a finger) and disposes the pressing device on or over the piezo-electric power source to obscure the piezo-electric power source and iLED. The piezo-electric power source is pressed with the pressing device and the pressing device is removed so that the piezo-electric power source is visible. The observer waits for a temporal delay equal to or greater than one tenth of a second, one quarter of a second, one half of a second, or one second, for example, and then observes light output from the output device after the temporal delay. The light output can vary, for example blink or vary in luminance.

Certain embodiments provide a piezo-electric structure using micro-transfer printing methods that can provide increased power when pressed with a pressing device. The increased power can be provided, through a control circuit, to an iLED so that the iLED emits light. The iLED is obscured by the pressing device and light output from the iLED is delayed until the pressing device is removed from the piezo-electric structure.

Certain embodiments provide a piezo-electric structure using micro-transfer printing methods that can provide increased power to an ILED and visibility to the light output from the iLED. The piezo-electric structure can be small or include small piezo-electric elements that facilitate integration on a small substrate.

In certain embodiments, a method of disposing one or more micro-modules on or in a support substrate to provide a light-emitting module structure comprises providing a micro-module source wafer comprising one or more individual (e.g., separate and independent) micro-modules. Each micro-module comprises a relatively rigid module substrate (compared to the support substrate), an inorganic light-emitting diode, a power source, and a control circuit. The inorganic light-emitting diode, power source, and control circuit are disposed on or in the module substrate and the control circuit receives power from the power source to control the inorganic light-emitting diode to emit light using electrical connections provided on the module substrate. If the support substrate comprises a light conductor, one or more of the micro-modules are disposed onto the support substrate. Otherwise one or more of the micro-modules are disposed onto the support substrate and a light conductor is disposed on the support substrate or the micro-module. The light conductor is disposed in alignment with the inorganic light-emitting diode so that the inorganic light-emitting diode emits light into the light conductor and the light conductor conducts the light beyond the micro-module to emit the light from a light-emitting location of the light-emitting module structure.

In certain embodiments, the micro-module source wafer can comprise one or more sacrificial portions. Each sacrificial portion can be disposed between anchor portions of the micro-module source wafer and each micro-module can be disposed completely over a sacrificial portion. One or more of the micro-modules are disposed onto the support substrate by micro-transfer printing one or more micro-modules from the micro-module source wafer to the support substrate and can comprise a portion of a tether, for example a broken, fractured, or separated tether.

One or more inorganic light-emitting diode (iLED) source wafers can also be provided, each comprising one or more sacrificial portions, each sacrificial portion disposed between anchor portions of the iLED source wafer, and each iLED is disposed completely over a sacrificial portion. In certain embodiments, methods comprise disposing one or more of the iLEDs onto the module substrate by micro-transfer printing one or more iLEDs from the iLED source wafer to the module substrate so that the iLED comprises a broken, fractured, or separated tether. Similarly, the control circuit or power source can be provided on respective source wafers and micro-transfer printed onto a module substrate together with a portion of a tether, for example a broken, fractured, or separated tether.

The support substrate can be a security or value document, a portion of a security or value document, or a layer on or in a security or value document. In certain embodiments, methods comprise disposing the support substrate onto or into a document substrate that is a security or value document, a portion of a security or value document, or a layer on or in a security or value document. In some embodiments, a method comprises laminating the support substrate to the document substrate, adhering the micro-module to the document substrate and removing the support substrate. A sealing or encapsulation layer can be provided over the micro-module on the document substrate to protect the micro-module.

Methods in accordance with some embodiments comprise a polymer carrier substrate and comprise disposing the micro-module on the polymer carrier and disposing the polymer carrier on the support substrate. Methods can comprise adhering the micro-module to the support substrate and removing the polymer carrier, providing a sealing or encapsulation layer over the micro-module, or providing a sealing or encapsulation layer over the support substrate and the micro-module.

According to methods in accordance with some embodiments, the power source is a piezo-electric power source, comprising a plurality of piezo-electric elements. Methods can comprise disposing one or more piezo-electric elements onto or over a piezo-electric element to form a stack of piezo-electric elements, disposing each of the one or more piezo-electric elements onto or over the module substrate and electrically connecting the piezo-electric elements, or micro-transfer printing one or more piezo-electric elements from a piezo-electric element source wafer onto the piezo-electric element.

The piezo-electric element can be disposed on the module substrate, for example by micro-transfer printing a piezo-electric element from a piezo-electric element source wafer onto the module substrate. In some embodiments, a method comprises forming a piezo-electric power source on the module substrate using photolithographic methods and materials. Some methods comprise disposing each of one or more electrical conductors over a piezo-electric element and disposing another piezo-electric element onto or over each electrical conductor and heating the electrical conductor and cooling the electrical conductor to adhere the piezo-electric element to the other piezo-electric element. All of the electrical conductors can be heated and cooled in a common step at the same time.

In some aspects, the present disclosure provides a light-emitting module structure, comprising: a support substrate; a micro-module disposed on or in the support substrate and extending over only a portion of the support substrate, the micro-module comprising a rigid module substrate, an inorganic light-emitting diode, a power source, and a control circuit, wherein the inorganic light-emitting diode, the power source, and the control circuit are each disposed on or in the module substrate and the control circuit, the power source, and the inorganic light-emitting diode are electrically connected such that the control circuit receives power from the power source to control the inorganic light-emitting diode to emit light; a light conductor disposed on or in the support substrate and in alignment with the micro-module such that the inorganic light-emitting diode is disposed to emit light into the light conductor and the light conductor conducts the light beyond the micro-module to emit the light from the light conductor.

In certain embodiments, the module substrate is a semiconductor substrate and the control circuit is formed at least partially in the module substrate.

In certain embodiments, at least one of (i) the control circuit is a micro-transfer printed integrated circuit comprising a circuit substrate separate (e.g., distinct and independent) from the module substrate and the support substrate and at least a portion of a fractured or separated tether, (ii) the inorganic light-emitting diode is a micro-transfer printed inorganic light-emitting diode (iLED) comprising an iLED substrate separate (e.g., distinct and independent) from the module substrate and the support substrate and at least a portion of a fractured or separated tether, and (iii) the power source is a micro-transfer printed power source comprising a power source substrate separate (e.g., distinct and independent) from the module and support substrates and at least a portion of a fractured or separated tether.

In certain embodiments, the power source comprises a solar cell, a piezo-electric structure, or an antenna. In certain embodiments, the power source comprises a stack of piezo-electric elements, wherein the piezo-electric elements of the stack are electrically connected in serial.

In certain embodiments, the micro-module comprises an electrical interconnection circuit that electrically interconnects the power source, the control circuit, and the inorganic light-emitting diode.

In certain embodiments, the light conductor comprises a reflector and a transparent layer, wherein the transparent layer is disposed adjacent to the reflector in a direction orthogonal to the support substrate. In certain embodiments, the light conductor comprises two reflectors and the transparent layer is disposed between two reflectors (e.g., wherein the transparent layer is or comprises the support substrate). In certain embodiments, the light conductor comprises a reflector and (i) the reflector is disposed on the support substrate between the support substrate and the micro-module, (ii) the reflector is disposed on the support substrate so that the support substrate is between the reflector and the micro-module, or (iii) the micro-module is disposed between the support substrate and the reflector. In certain embodiments, the light conductor comprises one or more light pipes. In certain embodiments, the light conductor comprises at least one of one or more diffusers, one or more light leaks, and one or more optical gaps disposed beyond the micro-module. In certain embodiments, the light conductor extends over only a portion of the support substrate providing optical gaps at the extremity of the light conductor.

In certain embodiments, the inorganic light-emitting diode is disposed such that the inorganic light-emitting diode emits light through the module substrate [e.g., primarily through the module substrate (i.e., such that a majority of light emitted from the inorganic light-emitting diode is emitted through the module substrate)]. In certain embodiments, the inorganic light-emitting diode primarily emits light in a direction away from the module substrate. In certain embodiments, the inorganic light-emitting diode is disposed between the module substrate and the support substrate. In certain embodiments, the module substrate is disposed between the inorganic light-emitting diode and the support substrate.

In certain embodiments, the support substrate is flexible. In certain embodiments, the support substrate is a security strip. In certain embodiments, the light-emitting module structure comprises a security or value document, wherein the security strip is disposed on or in the security or value document. In certain embodiments, the support substrate is at least a portion of a security or value document (e.g., is a security or value document) or a layer on or in a security or value document.

In some aspects, the present disclosure provides a piezo-electric power source, comprising a stack of piezo-electric elements that are electrically connected in serial, wherein the piezo-electric elements of the stack are responsive to mechanical pressure to produce electrical power.

In certain embodiments, the piezo-electric power source comprises an electrical conductor disposed in the stack between at least two of the piezo-electric elements.

In certain embodiments, the piezo-electric elements are no more than 500 microns thick (e.g., no more than 200 microns thick, no more than 100 microns thick, no more than 50 microns thick, no more than 20 microns thick, no more than 10 microns thick, or no more than 5 microns thick). In certain embodiments, the stack of piezo-electric elements has a thickness of at least 100 microns (e.g., at least 500 microns, at least one mm, at least two mm, at least four mm, at least five mm, or at least 10 mm). In certain embodiments, the stack of piezo-electric elements comprises two, three, four, five, ten, twenty, fifty, or one hundred piezo-electric elements.

In certain embodiments, the stack of piezo-electric elements comprises at least three (e.g., at least four, at least five, at least ten, at least twenty, at least fifty, or at least one hundred piezo-electric elements). In certain embodiments, the stack has an area in a plane orthogonal to the stack of piezo-electric elements (e.g., a stacking direction of the stack) of no more than 100 mm$^2$ (e.g., no more than 25 mm$^2$, no more than one mm$^2$, no more than 250,000 μm$^2$, no more than 40,000 μm$^2$, no more than 10,000 μm$^2$, no more than 2,500 μm$^2$, no more than 1,000 μm$^2$, no more than 500 μm$^2$, or no more than 100 μm$^2$).

In certain embodiments, the piezo-electric power source comprises a plurality of stacks of piezo-electric elements, wherein the stacks of piezo-electric elements in the plurality of stacks of piezo-electric elements are electrically connected in parallel. In certain embodiments, the piezo-electric power source comprises a plurality of stacks of piezo-electric elements (e.g., wherein the stacks in the plurality of stacks are electrically connected in parallel) wherein each stack of the plurality of stacks of piezo-electric elements is spatially separated from every other stack of piezo-electric elements. In certain embodiments, the piezo-electric power source comprises a plurality of stacks of piezo-electric elements, wherein the stacks of piezo-electric elements in the plurality of stacks of piezo-electric elements are electrically connected in parallel and each stack of the plurality of stacks of piezo-electric elements is spatially separated from every other stacks of piezo-electric elements.

In certain embodiments, one or more of the piezo-electric elements of the stack of piezo-electric elements is a piezo-electric capacitor.

In certain embodiments, the piezo-electric power source comprises a control circuit, electrically connected to the stack of piezo-electric elements, for storing at least a portion of the electrical power. In certain embodiments, the piezo-electric power source comprises a control circuit, electrically connected to the stack of piezo-electric elements, for converting the electrical power from one voltage to another voltage, from one current to another current, or from one temporal duration to another temporal duration. In certain embodiments, the control circuit is for converting the electrical power from one temporal duration to another temporal duration and the control circuit is adapted to convert a press duration that is a temporal duration that mechanical pressure is applied to the stack of piezo-electric elements to an output duration during which energy is output. In certain embodiments, the control circuit controls the output duration to be temporally delayed from the press duration by at least one msec. In certain embodiments, the output duration is less than the press duration. In certain embodiments, the output duration is greater than the press duration. In certain embodiments, the output duration is greater than or equal to one msec.

In certain embodiments, the piezo-electric power source comprises a support substrate and the stack of piezo-electric elements is disposed on the support substrate, or the piezo-electric power source comprises a module substrate, and the stack of piezo-electric elements is disposed on the module substrate.

In some aspects, the present disclosure provides A method of making a piezo-electric power source, comprising: providing a power-source substrate; providing one or more element wafers, each of the one or more element wafers comprising one or more piezo-electric elements, each of the one or more piezo-electric element disposed over a sacrificial portion of the element wafer separated by anchor portions of the element wafer; and releasing and transferring (e.g., micro-transfer printing) one or more piezo-electric elements from the one or more element wafers onto or over a piezo-electric element on the power-source substrate (e.g., after releasing and micro-transfer printing one or more piezo-electric elements from the one or more element wafers onto or over the power-source substrate)(e.g., thereby forming one or more stacks of piezo-electric elements). In certain embodiments, the method comprises providing an electrical conductor between the piezo-electric elements; and optionally, heating or cooling the electrical conductor to adhere piezo-electric elements in a stack to each other.

In some aspects, the present disclosure provides a piezo-electric device, comprising: a piezo-electric power source for converting mechanical pressure into electrical power; a control circuit electrically connected to the piezo-electric power source; an output device electrically connected and responsive to the control circuit to output energy, wherein the control circuit controls the output device to output energy for a temporal output duration and the temporal output duration is temporally delayed from a press duration by a temporal delay of at least one msec (e.g., and no more than one minute), wherein the press duration is a duration during which mechanical pressure is applied to the piezo-electric power source (e.g., a stack of piezo-electric elements in the piezo-electric power source).

In certain embodiments, the temporal output duration is less than the press duration. In certain embodiments, the temporal output duration is greater than the press duration. In certain embodiments, the temporal output duration is greater than or equal to one msec.

In certain embodiments, the control circuit is for converting the electrical power from one voltage to another voltage, from one current to another current, or from one temporal duration to another temporal duration.

In certain embodiments, the piezo-electric device comprises a stack of piezo-electric elements responsive to mechanical pressure to produce electrical power, wherein the piezo-electric elements in the stack of piezo-electric elements are electrically connected in serial (e.g., wherein the piezo-electric power source comprises the stack of piezo-electric elements).

In certain embodiments, the piezo-electric device comprises an electrical conductor disposed in the stack between at least two piezo-electric elements.

In certain embodiments, the piezo-electric elements are no more than 500 microns thick (e.g., no more than 200 microns thick, no more than 100 microns thick, no more than 50 microns thick, no more than 20 microns thick, no more than 10 microns thick, or no more than five microns thick). In certain embodiments, the stack of piezo-electric elements no less than one mm thick (e.g., no less than two mm thick, no less than four mm thick, no less than five mm thick, or no less than 10 mm thick). In certain embodiments, the stack of piezo-electric elements comprises two, three, four, five, ten, twenty, fifty, or one hundred piezo-electric elements. In certain embodiments, the stack of piezo-electric elements comprises at least three (e.g., at least four, at least five, at least ten, at least twenty, at least fifty, or at least one hundred piezo-electric elements). In certain embodiments, the stack has an area in a plane orthogonal to the stack of piezo-electric elements (e.g., a stacking direction of the stack) of no more than 100 $mm^2$ (e.g., no more than 25 $mm^2$, no more than one $mm^2$, no more than 250,000 $\mu m^2$, no more than 40,000 $\mu m^2$, no more than 10,000 $\mu m^2$, no more than 2,500 $\mu m^2$, no more than 1,000 $\mu m^2$, no more than 500 $\mu m^2$, or no more than 100 $\mu m^2$).

In certain embodiments, the piezo-electric device comprises a plurality of stacks of piezo-electric elements, wherein the stacks of piezo-electric elements in the plurality of stacks of piezo-electric elements are electrically connected in parallel. In certain embodiments, each stack of the plurality of stacks of piezo-electric elements is spatially separated from every other stack of piezo-electric elements. In certain embodiments, one or more of the piezo-electric elements of the stack of piezo-electric elements is a piezo-electric capacitor.

In certain embodiments, the control circuit comprises circuitry for storing at least a portion of the electrical power.

In certain embodiments, the piezo-electric device comprises a support substrate and wherein the piezo-electric power source is disposed on the support substrate. In certain embodiments, the support substrate is flexible.

In certain embodiments, the piezo-electric device comprises a plurality of stacks of piezo-electric elements, wherein the stacks in the plurality of stacks of piezo-electric elements are electrically connected in serial and each stack of the plurality of stacks of piezo-electric elements is spatially separated from every other stack of piezo-electric elements.

In some aspects, the present disclosure provides a method of operating a piezo-electric device for converting mechanical pressure into electrical power, comprising: providing the piezo-electric device (e.g., disposed on a security or value document), wherein the piezo-electric device comprises: a piezo-electric power source, a control circuit electrically connected to the piezo-electric power source, and an output device electrically connected and responsive to the control circuit to output energy, wherein the control circuit controls the output device to output energy for a temporal output duration and the output duration is temporally delayed from the press duration by at least one msec, wherein the press duration is a duration during which mechanical pressure is applied to the piezo-electric power source (e.g., a stack of piezo-electric elements in the piezo-electric power source); disposing a pressing device on or over the piezo-electric power source (e.g., such that the pressing device obscures (e.g., contacts) the piezo-electric power source); pressing the piezo-electric power source with the pressing device and removing the pressing device [e.g., such that the piezo-electric power source is visible (e.g., is not in contact with the pressing device)]; waiting for a temporal delay of no less than one tenth of a second (e.g., no less than one quarter of a second, no less than one half of a second, or no less than one second) (e.g., and no more than one minute); and receiving (e.g., observing) light output from the output device after the temporal delay.

In some aspects, the present disclosure provides a method of operating a piezo-electric device for converting mechanical pressure into electrical power, comprising: providing the piezo-electric device (e.g., disposed on a security or value document), wherein the piezo-electric device comprises: a piezo-electric power source, a control circuit electrically connected to the piezo-electric power source, and an output device electrically connected and responsive to the control circuit to output energy, wherein the control circuit controls the output device to output energy for a temporal output duration and the output duration is temporally delayed from the press duration by at least one msec, wherein the press duration is a duration during which mechanical pressure is applied to the piezo-electric power source (e.g., a stack of piezo-electric elements in the piezo-electric power source); transferring mechanical pressure from a pressing device into the piezo-electric power source of the piezo-electric device, wherein light is output from the output device after a temporal delay of no less than one tenth of a second (e.g., no less than one quarter of a second, no less than one half of a second, or no less than one second) (e.g., and no more than one minute).

In some aspects, the present disclosure provides A method of disposing one or more micro-modules on or in a support substrate to provide a light-emitting module structure, comprising: providing a micro-module source wafer comprising one or more individual (e.g., separate and independent) micro-modules, each of the one or more individual micro-modules comprising: a rigid module substrate, an inorganic light-emitting diode, a power source, and a control circuit, wherein the inorganic light-emitting diode, the power source, and the control circuit are each disposed on or in the module substrate and electrically connected such that the control circuit receives power from the power source to control the inorganic light-emitting diode to emit light; and if the support substrate comprises a light conductor (e.g., disposed at a surface thereof), disposing the one or more micro-modules from the micro-module source wafer onto the support substrate, or else disposing (i) the one or more micro-modules on the support substrate and (ii) a light conductor on at least one of the support substrate and the micro-module, such that the light conductor is disposed in alignment with the inorganic light-emitting diode such that the inorganic light-emitting diode emits light into the light conductor and the light conductor conducts the light beyond the micro-module to emit the light from the light-emitting module structure.

In certain embodiments, the micro-module source wafer comprises one or more sacrificial portions, each sacrificial portion is disposed between anchor portions of the micro-module source wafer, and each micro-module is disposed completely over a sacrificial portion of the one or more sacrificial portions, and the method comprises: disposing one or more micro-modules from the micro-module source wafer onto the support substrate by micro-transfer printing the one or more micro-modules from the micro-module source wafer to the support substrate. In certain embodiments, the method comprises providing one or more inorganic light-emitting diode (iLED) source wafers comprising one or more sacrificial portions, each sacrificial portion disposed between anchor portions of the iLED source wafer, and each iLED is disposed completely over a sacrificial portion of the one or more sacrificial portions; and disposing one or more iLEDs from the one or more iLED source wafers onto the module substrate by micro-transfer printing the one or more iLEDs from the iLED source wafer to the module substrate.

In certain embodiments, the support substrate is at least a portion of a security or value document (e.g., is a portion of a security or value document) or a layer on or in a security or value document. In certain embodiments, the method comprises disposing the support substrate onto or into a document substrate that is at least a portion of a security or value document (e.g., a portion of a security or value document) or a layer on or in a security or value document. In certain embodiments, the method comprises: adhering the one or more micro-modules from the micro-module source wafer to the document substrate; and removing the support substrate. In certain embodiments, the method comprises: providing a sealing or encapsulation layer over the one or more micro-modules from the micro-module source wafer on the document substrate.

In certain embodiments, the method comprises: disposing the one or more micro-modules from the micro-module source wafer on a polymer carrier (e.g., prior to disposing the one or more micro-modules on the support substrate); and disposing the polymer carrier on or over the support substrate (e.g., wherein the one or more micro-modules are disposed between the polymer carrier and the support substrate). In certain embodiments, the method comprises: adhering the one or more micro-modules from the micro-module source wafer to the support substrate; and removing the polymer carrier.

In certain embodiments, the method comprises providing a sealing or encapsulation layer over the one or more micro-modules from the micro-module source wafer. In certain embodiments, the method comprises providing a sealing or encapsulation layer over the support substrate and the one or more micro-modules from the micro-module source wafer disposed on the support substrate.

In certain embodiments, the power source is a piezo-electric power source comprising a plurality of piezo-electric elements. In certain embodiments, the method comprises disposing one or more piezo-electric elements onto or over a piezo-electric element to form a stack of piezo-electric elements. In certain embodiments, the method comprises: disposing each of the plurality of piezo-electric elements onto or over the module substrate; and electrically connecting the plurality of piezo-electric elements. In certain embodiments, disposing the one or more piezo-electric elements onto or over the piezo-electric element to form the stack comprises micro-transfer printing one or more piezo-electric elements from a piezo-electric element source wafer onto the piezo-electric element.

In certain embodiments, the piezo-electric element is disposed on the module substrate. In certain embodiments, the piezo-electric element is disposed on the module substrate by micro-transfer printing the piezo-electric element from a piezo-electric element source wafer onto the module substrate.

In certain embodiments, the method comprises: disposing each of one or more electrical conductors over a piezo-electric element of the plurality of piezo-electric elements; and disposing a further piezo-electric element of the plurality of piezo-electric elements onto or over each electrical conductor. In certain embodiments, the method comprises:

heating the one or more electrical conductors; and cooling (e.g., subsequently) the one or more electrical conductors to adhere the piezo-electric element to the further piezo-electric element. In certain embodiments, the method comprises: heating all of the one or more electrical conductors simultaneously for a period of time; and cooling (e.g., subsequently) all of the one or more electrical conductors simultaneously for a second period of time. Certain embodiments provide methods for making a light-emitting module structure that has a reduced size and cost and integrating the light-emitting module structure into a document substrate. The light-emitting module structure resists environmental and mechanical damage.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A and 1B are cross sections of module structures according to illustrative embodiments of the present disclosure;

FIGS. 2A-2C are cross sections of module structures according to illustrative embodiments of the present disclosure;

FIGS. 3-6 are cross sections of module structures according to illustrative embodiments of the present disclosure;

FIGS. 7 and 8 are plan views of module structures according to illustrative embodiments of the present disclosure;

FIGS. 9A-9C are plan views of piezo-electric elements according to illustrative embodiments of the present disclosure;

Figure 2C:
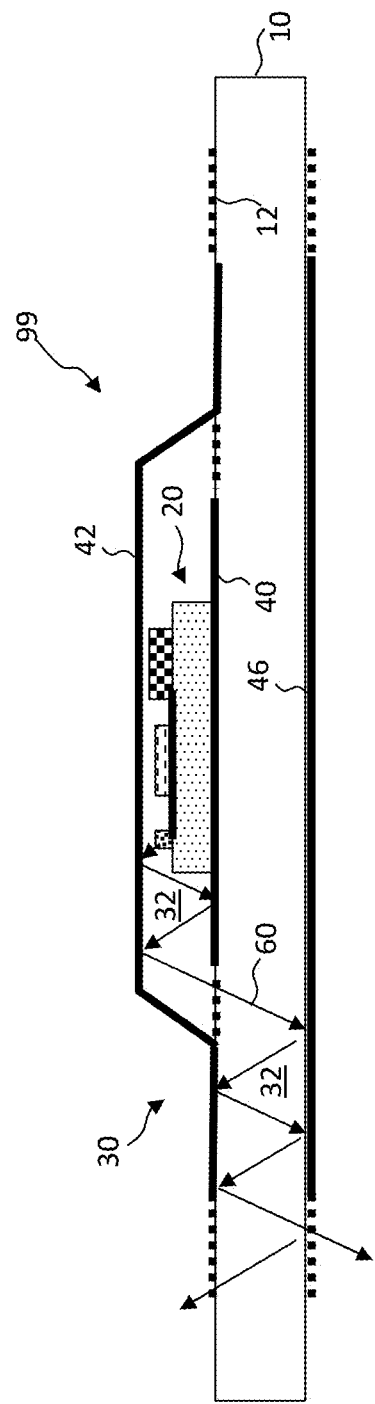

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

The present disclosure provides, inter alia, structures and methods for incorporating and providing power to light-emitting elements in or on a support substrate. The light-emitting elements are disposed on a rigid module substrate in a micro-module. A light conductor conducts light from the light-emitting elements to a location on the support substrate remote from the micro-module. Such structures in value or security documents can provide anti-counterfeiting features and document validation to users of the document.

Referring to FIGS. 1A, 1B, 2A, 2B and 3-6, in various illustrative embodiments, a light-emitting module structure 99 comprises a support substrate 10 and a micro-module 20 disposed on or in the support substrate 10. The micro-module 20 extends over only a portion of the support substrate 10 so that the micro-module 20 covers only a portion of the support substrate 10 and does not cover the entire support substrate 10. The support substrate 10 can be a flexible substrate, for example a polymer or paper substrate.

The micro-module 20 can comprise a rigid module substrate 28, an inorganic light-emitting diode (iLED) 50, a power source 22, and a control circuit 24. (For clarity, the control circuit 24 and power source 22 are not separately illustrated in FIGS. 3-6.) In some embodiments, the module substrate 28 is more rigid than the support substrate 10 and the support substrate 10 is more flexible than the module substrate 28. The inorganic light-emitting diode 50, the power source 22, and the control circuit 24 are disposed on or in the module substrate 28 and the control circuit 24 receives power from the power source 22 through electrical connections 26 to control the inorganic light-emitting diode 50 to emit light 60.

The light-emitting module structure 99 comprises a light conductor 30 disposed on or in the support substrate 10 and in alignment with the micro-module 20 so that the inorganic light-emitting diode 50 is disposed to emit light 60 into the light conductor 30. In some embodiments, the light conductor 30 extends over only a portion of the support substrate 10. The light conductor 30 can cover the entire micro-module 20 or only a portion of the micro-module 20. The light conductor 30 conducts the light 60 beyond or away from the micro-module 20 to emit the light 60 from the light conductor 30 or support substrate 10 at light-emitting locations 12 remote from the micro-module 20. Light 60 can be emitted from the light-emitting module structure 99, for example, at the locations of diffusers, light-leaking structures, optical gaps (openings) in the light conductor 30, or at the ends, distal ends, or extremities of the light conductor 30 at the furthest extent of the light conductors 30 away from the micro-module 20. The light-emitting locations 12 can be located beyond an extent of the micro-module 20. Light 60 can be emitted into optical structures, such as diffractive gratings or holograms.

The light conductor 30 can be a waveguide or a light-pipe and can comprise a light-transmissive layer 32 disposed between reflective layers 40 and 42 (also called reflectors, 40, 42) or a light-transmissive cylinder coated or surrounded by a cladding or higher-index structure or layer (not shown). Light-transmissive or transparent means at least partially transparent or light-transmissive to visible light, for example at least 30%, at least 50%, at least 70%, at least 80% or at least 90% transmissive to visible light. In some embodiments, the light is infrared or ultraviolet electromagnetic radiation. Thus, in some embodiments, the light conductor 30 comprises a reflector 40, 42 (e.g., reflective layers 40, 42) and a transparent light-transmissive layer 32 adjacent to the reflector in a direction orthogonal to the support substrate 10 or disposed between two reflectors 40, 42.

As shown in FIGS. 1A, 1B, 2A, 2B, the transparent, light-transmissive layer 32 and the reflectors 40, 42 can be disposed in different locations. In some embodiments, the reflector 40 is disposed on the support substrate 10 between the support substrate 10 and the micro-module 20, the reflector 40, 42 is disposed on the support substrate 10 so that the support substrate 10 is between the reflector 40 and the micro-module 20, or the micro-module 20 is disposed between the support substrate 10 and the reflector 40.

Referring to FIGS. 1A and 1B, the reflector 40 is disposed on a side of the support substrate 10 opposite the micro-module 20 and the reflector 42 is disposed over the micro-module 20 and opposite the surface of the support substrate 10 on which the micro-module 20 is disposed. The light-transmissive layer 32 is disposed between the reflectors 40, 42. In FIG. 1A, the reflector 42 of the light conductor 30 extends beyond the micro-module 20 and over only a portion of the support substrate 10 but does not extend over the entire support substrate 10, so that light 60 can escape and be emitted from the light-emitting module structure 99 through light-emission locations 12. The reflector 40 can, but need not necessarily, extend over the entire surface of the support substrate 10. As shown in FIG. 1A, light-emitting locations 12 are disposed on the surface of the support substrate 10 on which the micro-module 20 is disposed to emit light 60 from the light conductor 30 from the side of the light-emitting module structure 99 on which the micro-module 20 is disposed.

In FIG. 1B, the reflector 40 of the light conductor 30 extends beyond the micro-module 20 and over only a portion of the support substrate 10 but does not extend over the entire support substrate 10, so that light 60 can escape and be emitted from the light-emitting module structure 99. The reflector 42 can, but need not necessarily, extend over the entire surface of the support substrate 10. As shown in FIG. 1B and in contrast to the structure of FIG. 1A, light-emitting locations 12 are disposed on the surface of the support substrate 10 opposite the surface on which the micro-module 20 is disposed to emit light 60 from the light conductor 30 from the side of the light-emitting module structure 99 opposite the side on which the micro-module 20 is disposed. In some embodiments, neither of the reflectors 40, 42 extends entirely over the support substrate 10 and light 60 is emitted from both sides of the light-emitting module structure 99 or support substrate 10. A reflector 40, 42 that comprises a light-emitting location 12 extends over only a portion of the support substrate 10 and does not extend over the entire support substrate 10.

Referring to FIGS. 2A and 2B, the reflector 40 is disposed on the same side of the support substrate 10 as that on which the micro-module 20 is disposed. The reflector 42 is disposed over the micro-module 20 and a surface of the light-transmissive layer 32. The light-transmissive layer 32 is disposed between the reflectors 40, 42. In FIG. 2A, the reflector 42 of the light conductor 30 extends beyond the micro-module 20 and over only a portion of the support substrate 10 but does not extend over the entire support substrate 10, so that light 60 can escape and be emitted from the light-emitting module structure 99 through light-emission locations 12. The reflector 40 can, but need not necessarily, extend over the entire surface of the support substrate 10. As shown in FIG. 2A, light-emitting locations 12 are disposed on the surface of the light-transmissive layer 32 to emit light 60 from the light conductor 30 from the side of the light-emitting module structure 99 on which the micro-module 20 is disposed. In FIG. 2B, the reflector 40 of the light conductor 30 extends beyond the micro-module 20 and over only a portion of the support substrate 10 but does not extend over the entire support substrate 10, so that light 60 can escape and be emitted from the light-emitting module structure 99 at light-emitting locations 12. The reflector 42 can, but need not necessarily, extend over the entire surface of the support substrate 10. As shown in FIG. 2B and in contrast to the structure of FIG. 2A, light-emitting locations 12 are disposed on the same surface of the support substrate 10 on which the micro-module 20 is disposed to emit light 60 from the light conductor 30 from the side of the light-emitting module structure 99 opposite the side on which the micro-module 20 is disposed. In some embodiments, neither of the reflectors 40, 42 extends entirely over the support substrate 10 and light 60 is emitted from both sides of the light-emitting module structure 99. A reflector 40, 42 that comprises a light-emitting location 12 extends over only a portion of the support substrate 10 and does not extend over the entire support substrate 10.

Referring to FIG. 2C, a third reflector/reflective layer 46 can be provided so that reflectors 40, 46 are disposed on both sides of the support substrate 10. Light 60 can travel through both the light-transmissive layer 32 between the reflectors 40, 42 and through the support substrate 10, so that at least portions of the support substrate 10 are also a part of the light-transmissive layer 32 and the light conductor 30. Light-emitting locations 12 can be disposed on either or both sides of the support substrate 10 to allow light to escape from the light-emitting module structure 99. Thus, either, but not both, of the reflectors 40, 46 can extend over the entire surface of the support substrate 10 on which they are respectively disposed, or, as shown, neither reflector 40, 46 extends over an entire support substrate 10 surface.

Figure 3:
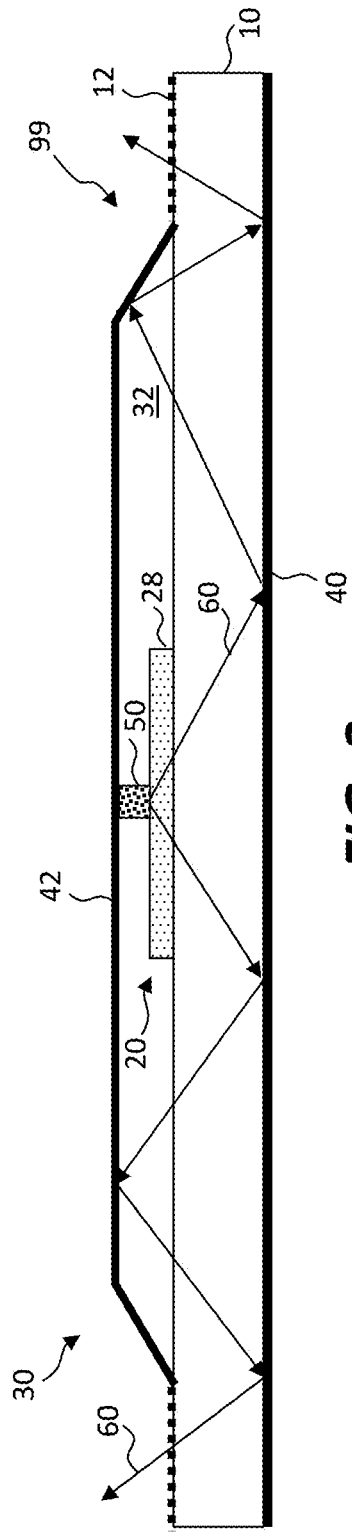
Figure 4:
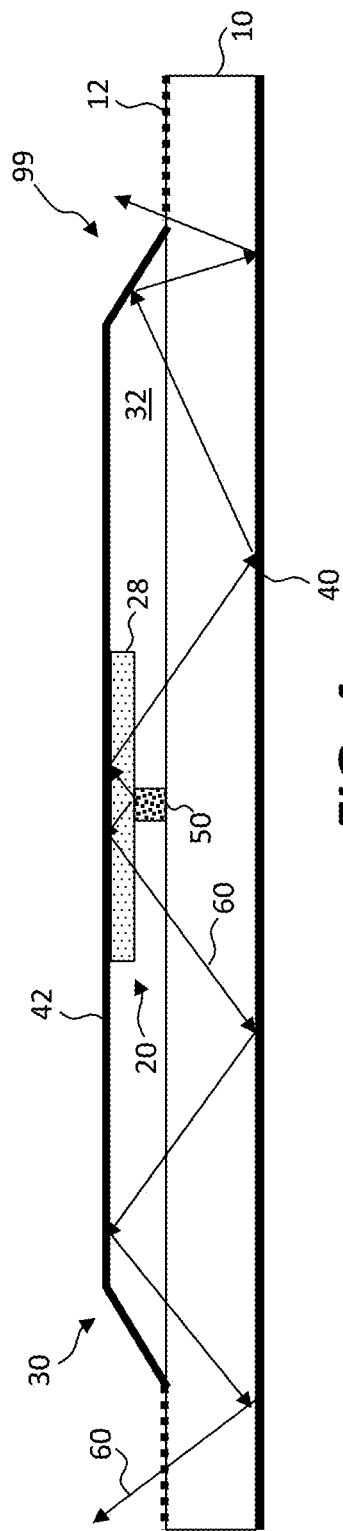

Referring to FIGS. 3-6, the micro-module 20 and iLED 50 can be oriented in different ways with respect to the support substrate 10. As shown in FIGS. 3 and 4, the iLED 50 is a bottom emitter that primarily emits light 60 through the module substrate 28 (which must be at least partially transparent). In FIG. 3, the module substrate 28 is disposed between the support substrate 10 and the iLED 50 primarily emits light 60 toward the reflector 40 and through the module substrate 28. In FIG. 4, the iLED 50 is disposed between the support substrate 10 and the module substrate 28 and primarily emits light 60 through the module substrate 28 toward the reflector 42. As shown in FIG. 5, the iLED 50 is a top emitter that primarily emits light 60 away from the module substrate 28 (which can be opaque or reflective). In FIG. 5, the iLED 50 is disposed between the support substrate 10 and the module substrate 28 and the iLED 50 primarily emits light 60 toward the reflector 40 and away from the module substrate 28. In FIG. 6, the module substrate 28 is disposed between the support substrate 10 and the iLED 50 emits light 60 both away from and through the modules substrate 28 (the iLED 50 is both a top emitter and a bottom emitter). Thus, the iLED 50 emits light 60 toward the reflector 42 and through the module substrate 28 toward the reflector 40. In some embodiments (not shown), the iLED 50 of FIG. 6 is a top emitter only and primarily emits light 60 toward the reflector 42. In FIGS. 3 and 4, the light-emitting locations 12 are disposed on the same side of the support substrate 10 as that on which the micro-modules 20 are disposed (as in FIGS. 1A and 2A). However, the light-emitting locations 12 could also be disposed on the opposite side of the support substrate 10 as that on which the micro-modules 20 are disposed. Similarly, in FIGS. 5 and 6, the light-emitting locations 12 are disposed on the opposite side of the support substrate 10 as that on which the micro-modules 20 are disposed (as in FIGS. 1B and 2B). However, the light-emitting locations 12 could also be disposed on the same side of the support substrate 10 as that on which the micro-modules 20 are disposed. In some embodiments, the light-emitting locations are disposed on both sides of the support substrate 10.

FIGS. 1-6 illustrate a light conductor 30 in cross section. FIG. 7 illustrates an embodiment showing a circular light conductor 30 in plan view with a light-emitting location 12 disposed in a ring around the circular light conductor 30, for example a diffuser, diffractive grating, hologram, or other optical structure. In some embodiments, the light conductor 30 can any of a variety of shapes, including rectangular or square, or an arbitrary shape with any combination of curves or straight lines, for example like a cross section of an amoeba or any simple closed curve. (In FIG. 7, the micro-module 20 and iLED 50 are illustrated for clarity but are disposed between the reflector 42 and the support substrate 10 and not visible in a top view.)

Referring to FIG. 8, in some embodiments, the light conductor 30 comprises one or more light pipes 44, for example a fiber optic structure with a cladding or a reflective layer around the outside of the fiber. The light pipe 44 is disposed to receive light 60 from the iLED 50 and transmit or conduct the light 60 away from the micro-module 20 to a light-emitting location 12. Light 60 is emitted from the light emitting location 12 at the distal end of the light pipe 44, with or without the assistance of a diffuser or other optical structure. Multiple light pipes 44 can comprise the light conductor 30 that transmit light 60 to corresponding multiple light-emitting locations 12.

The control circuit 24 can be an integrated circuit formed separately from the module substrate 28 and disposed on the module substrate 28, for example by micro-transfer printing, as shown in FIG. 1A. In some embodiments, the module substrate 28 is a semiconductor substrate, for example a silicon substrate, and the control circuit 24 is formed at least partially in or on the module substrate 28, as shown in FIG. 1B.

In some embodiments, the power source 22 or the iLED 50, or both the power source 22 and the iLED 50, can be an integrated structure formed separately from the module substrate 28 and disposed on the module substrate 28, for example by micro-transfer printing. Thus, the control circuit 24 can be a micro-transfer printed integrated circuit having a circuit substrate separate (e.g., distinct and independent) from the module substrate 28 and support substrate 10. Similarly, the inorganic light-emitting diode 50 can be a micro-transfer printed light emitter having an iLED substrate separate (e.g., distinct and independent) from the module substrate 28 and support substrate 10 and the power source 22 can be a micro-transfer printed power source 22 having a power source substrate separate (e.g., distinct and independent) from the module substrate 28 and support substrate 10. Each of the control circuit 24 (when a separate integrated circuit), the iLED 50, and the power source 22 can be provided over one or more sacrificial portions between anchor portions of a source wafer and connected to an anchor portion with a tether. When micro-transfer printed, the tether connecting the control circuit 24, iLED 50, or power source 22 to the anchor portion of the source wafer is fractured or separated leaving a tether portion 90 attached to the printed component (FIG. 1A). The micro-module 20 can also be provided over one or more sacrificial portions between anchor portions of a source wafer and connected to an anchor portion with a tether, and micro-transfer printed to the support substrate 10 so leaving a fractured or separated tether 90 (FIG. 1A).

Figure 10:
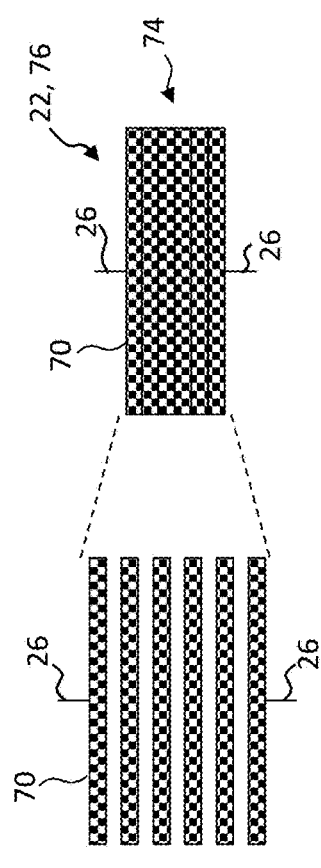
FIGS. 10-11 are cross sections of piezo-electric elements and structures with exploded views according to illustrative embodiments of the present disclosure.

In some embodiments, the power source 22 comprises a battery, a solar cell, a piezo-electric structure, or an antenna. Referring to FIGS. 9A, 9B, 9C, 10 and 11, the power source 22 can be a piezo-electric device 76 electrically connected to electrical connections 26 that generates electrical power in response to mechanical pressure. The piezo-electric device 76 can be a piezo-electric capacitor or comprise elements that are piezo-electric capacitors and can be disposed on the module substrate 28 or in general on any suitable substrate (e.g., support substrate 10). Referring to FIG. 9A, the piezo-electric device 76 can be a single, monolithic piezo-electric element 70 disposed on the module substrate 28. As shown in FIG. 9B, the piezo-electric device 76 comprises multiple piezo-electric elements 70 electrically connected in parallel and distributed and spatially separated over a portion of the module substrate 28. As shown in FIG. 9C, the piezo-electric device 76 comprises multiple piezo-electric elements 70 electrically connected in serial and distributed over a portion of the module substrate 28. Referring to FIG. 10, multiple piezo-electric elements 70 are disposed in a stack 74, for example a vertical stack disposed orthogonally to the module substrate 28 or support substrate 10 (shown in FIG. 1A). The individual piezo-electric elements 70 can be micro-transfer printed on top of each other and can each comprise a fractured or separated tether 90 (not shown in FIG. 10 or 11). In some embodiments, the multiple piezo-electric elements 70 of FIGS. 9B and 9C are stacks 74 of multiple piezo-electric elements 70 where the piezo-electric elements 70 in each stack 74 are serially connected and the stacks 74 are electrically connected in parallel (FIG. 9B) or in serial (FIG. 9C). As shown in FIGS. 9B and 9C for individual piezo-electric elements 70, each stack 74 of the plurality of stacks of piezo-electric elements 74 is spatially separated from every other stack of piezo-electric elements 74.

Figure 17:
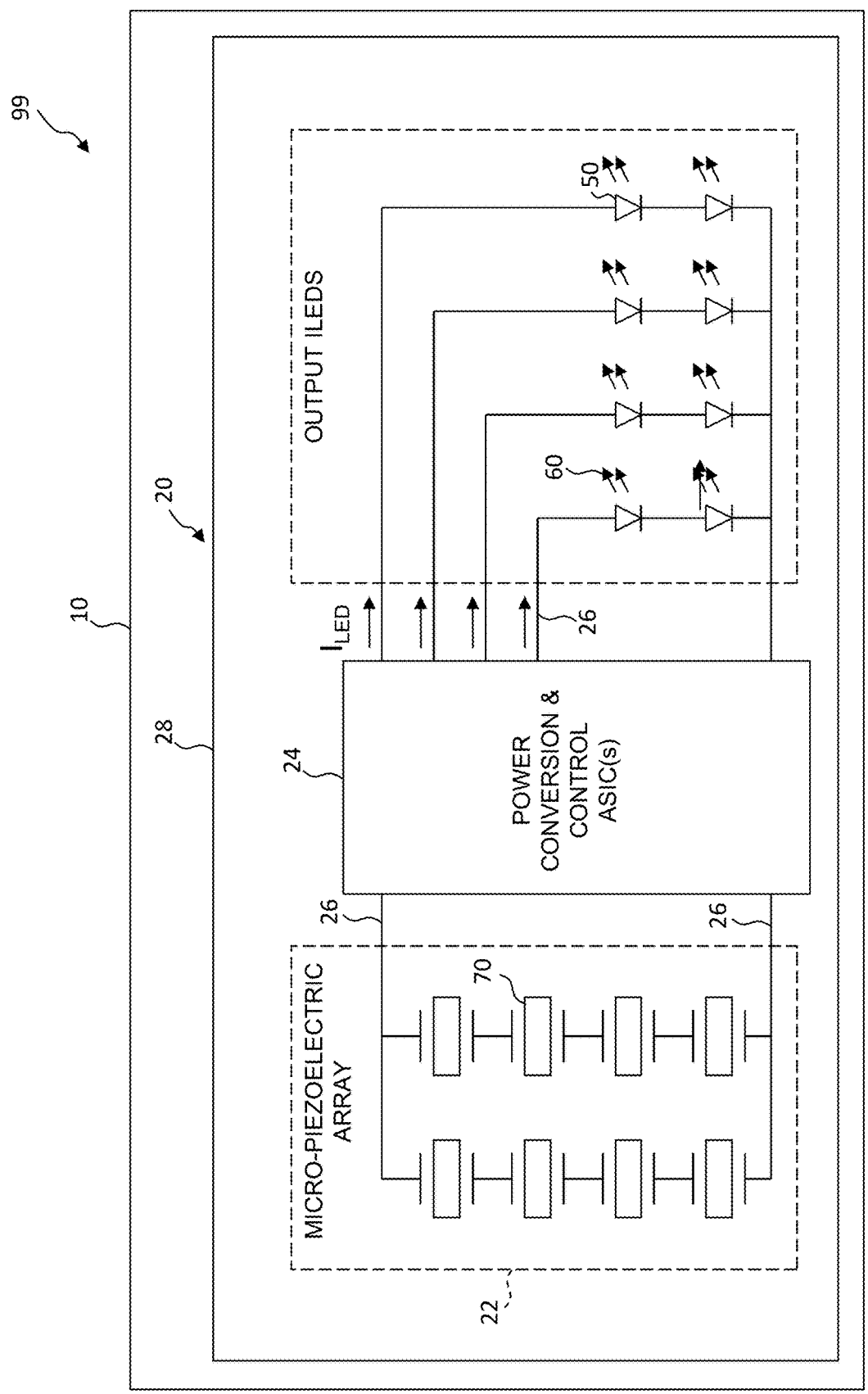
FIG. 17 is a circuit schematic of a module structure according to illustrative embodiments of the present disclosure.

A schematic diagram of embodiments of the light-emitting module structure 99 is shown in FIG. 17. As shown in FIG. 17, a micro-module 20 is disposed on a support substrate 10. FIG. 17 is not drawn to scale; in practice, the micro-module 20 is much smaller than the support substrate 10, for example the micro-module 20 can have an area of ten thousand square microns and the support substrate 10 can have an area of one hundred square centimeters. The micro-module 20 comprises a module substrate 28 on which is disposed a power source 22, control circuit 24, and iLEDs 50 electrically connected with electrical connections 26. The power source 22 can, for example, comprise an array of piezo-electric elements 70 electrically connected to the control circuit 24 with electrical connections 26 on the module substrate 28. The control circuit 24, in turn controls the light 60 output from the iLEDs 50. For clarity of illustration, the light conductor 30 is omitted from FIG. 17.

Figure 16:
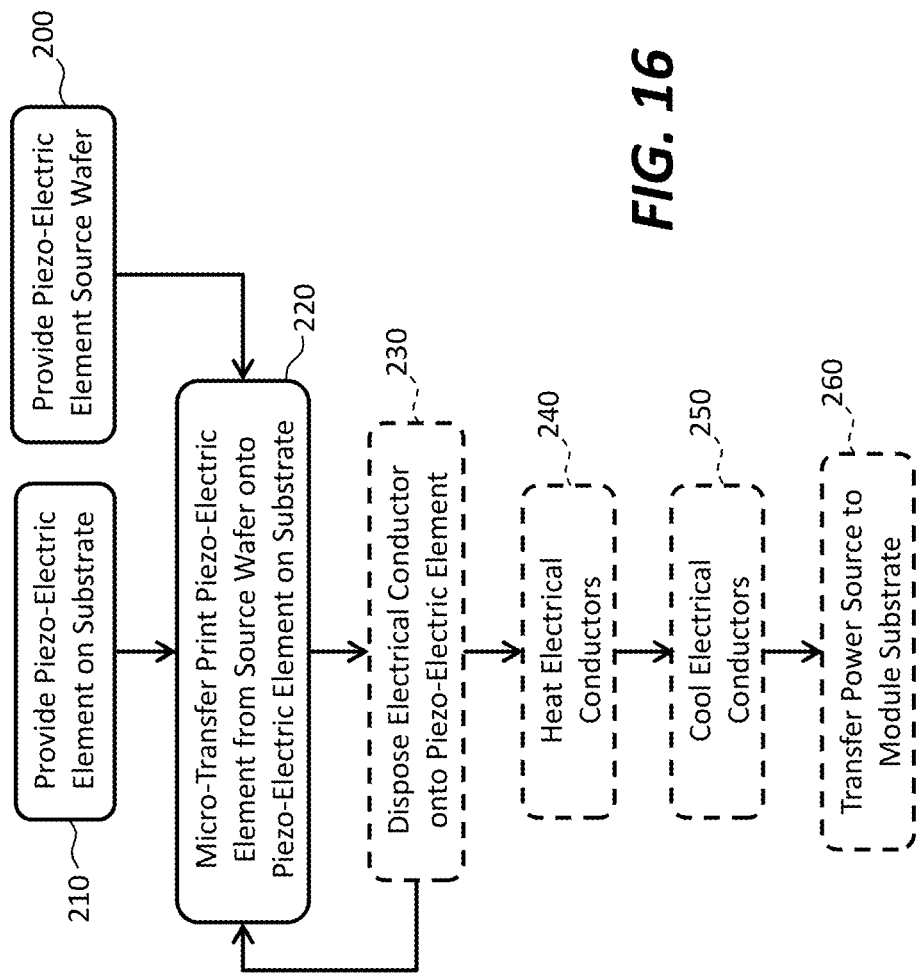

Referring to the flow diagram of FIG. 16, in step 200 the piezo-electric elements 70 can be provided on or in a piezo-electric element source wafer from which piezo-electric elements 70 can be micro-transfer printed. The stack 74 of piezo-electric elements 70 can, itself, be micro-transfer printed. Thus, in some embodiments, a first piezo-electric element 70 is micro-transfer printed onto a power-source substrate such as a module substrate 28 in step 210, for example on an electrical contact pad that is part of an electrical connection 26 on the module substrate 28. Subsequent piezo-electric elements 70 can be micro-transfer printed onto the first and subsequent piezo-electric elements 70 in step 220. In some embodiments, a piezo-electric element source wafer includes a first micro-transfer printable piezo-electric element 70 (step 210). Subsequent piezo-electric elements 70 are micro-transfer printed onto the first piezo-electric element 70 to form a stack 74 of piezo-electric elements 70 (step 220). The stack 74 of piezo-electric elements 70 can then be micro-transfer printed or otherwise transferred from the source wafer, for example onto the module substrate 28 (step 260, shown with dashes to indicate an optional step). Thus, according to some embodiments, a method of making a piezo-electric power source 22 comprises providing one or more element wafers, each element wafer comprising one or more piezo-electric elements 70, each piezo-electric element 70 disposed over a sacrificial portion separated by anchor portions of the element wafer (step 200), providing a power-source substrate (step 210) such as a module substrate 28 or power-source wafer that has a piezo-electric element 70 already disposed thereon (for example, either by micro-transfer printing a first piezo-electric element 70 thereon or forming the first piezo-electric element 70 thereon), and releasing and micro-transfer printing one or more piezo-electric elements 70 from the one or more element wafers onto or over a piezo-electric element 70 on the power-source substrate to form a serially connected stack 74 of piezo-electric elements 70. Optionally, the stack 74 can be transferred to a power-source substrate, for example a module substrate 28, by micro-transfer printing or other transfer methods if the stack 74 is not formed directly on the power-source substrate (step 260).

Figure 11:
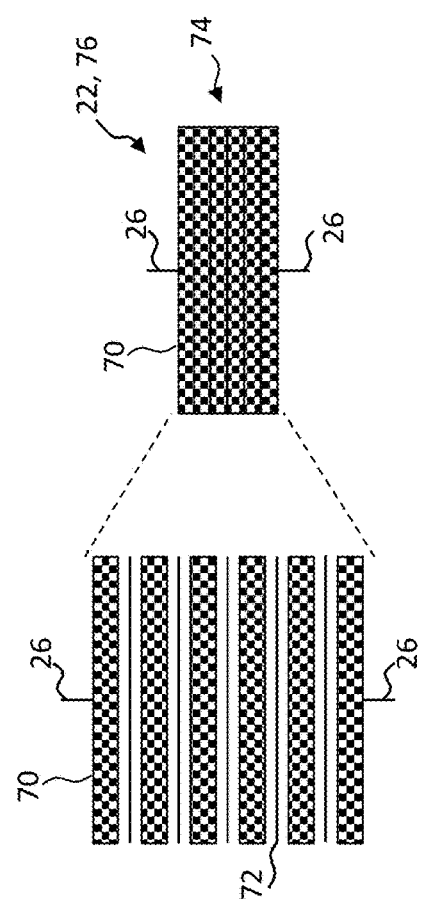

As shown in FIG. 11, an electrical conductor 72 can be disposed between the individual piezo-electric elements 70 in the stack 74 (step 230 in FIG. 16). The electrical conductors 72 can be adhesive and can melt at a relatively low temperature (step 240). When cooled in step 250, the electrical conductors 72 can firmly adhere the individual piezo-electric elements 70 in the stack 74. The electrical conductors 72 can be, for example, a solder or solder-like material and can be deposited, for example, by evaporation or coating and patterned, as necessary, by photolithographic patterning or other methods. Thus, in methods in accordance with some embodiments, one or more piezo-electric elements 70 can be provided to comprise the power source 22. One or more piezo-electric elements 70 can be disposed onto or over a piezo-electric element 70. Piezo-electric elements 70 can be disposed in a stack 74 of piezo-electric elements 70, for example by micro-transfer printing a piezo-electric element 70 from a piezo-electric element source wafer onto another piezo-electric element 70. Each of the one or more piezo-electric elements 70 or stacks 74 of piezo-electric elements 70 can be disposed onto or over the module substrate 28 and electrically connected, for example with electrical connections 26. Each of one or more electrical conductors 72 is disposed over a piezo-electric element 70 and another piezo-electric element 70 is disposed onto or over each electrical conductor 72. The electrical conductor 72 can be heated and cooled to adhere the piezo-electric element 70 to the other piezo-electric element 70. All of the electrical conductors 72 can be heated or cooled in a common step at the same time.

By providing a stack 74 of piezo-electric elements 70, a larger, more powerful piezo-electric structure and power source 22 can be provided. Assembling large piezo-electric structures on small substrates can be difficult. By micro-transfer printing the piezo-electric elements 70, a larger piezo-electric structure can be made in a smaller space. Thus, in some embodiments the piezo-electric elements 70 are less than or equal to 500 microns thick, 200 microns thick, 100 microns thick, 50 microns thick, 20 microns thick, 10 microns thick, or 5 microns thick and the stack 74 of piezo-electric elements 70 is greater than or equal to 100 microns thick, 500 microns thick, one mm thick, two mm thick, four mm thick, five mm thick, or 10 mm thick. The stack 74 of piezo-electric elements 70 can comprise two, three, four, five, ten, twenty, fifty, or one hundred piezo-electric elements 70, or more (e.g., at least three, at least four, at least five, at least 10, at least 20, at least 50, or at least one hundred piezo-electric elements) and the stack 74 can have an area in a plane orthogonal to the piezo-electric elements 70 stack 74 (e.g., in the stack direction, a vertical direction with respect to a surface of the module substrate 28 or support substrate 10) of less than or equal to 100 square mm, 25 square mm, one square mm, 250,000 square microns, 40,000 square microns, 10,000 square microns, 2,500 square microns, 1,000 square microns, 500 square microns, or 100 square microns. A smaller area reduces the size of the micro-module 20 and thereby increases the flexibility of the support substrate 10.

In the micro-module 20, the power source 22, control circuit 24, and iLED 50 can be electrically connected by electrical connections 26 at least partially on the module substrate 28 so that, responsive to power supplied from the power source 22, the control circuit 24 controls the iLED 50 to emit light 60 into the light conductor 30. In some embodiments, the control circuit 24 is electrically connected through electrical connections 26 to a power source 22 comprising a piezo-electric device, for example individual piezo-electric elements 70, multiple piezo-electric elements 70, or stacks 74 of piezo-electric elements 70.

The control circuit 24 can store power generated by or received from the power source 22 and use the stored power to control the iLED 50 for a period of time longer than the period of time for which the power source 22 is providing power. For example, the control circuit 24 can comprise one or more capacitors. Moreover, the control circuit 24 can incorporate power converters for converting power from the power source 22 to a voltage and current suitable for the control circuit 24 and iLEDs 50. Thus, according to embodiments, the control circuit 24 can convert the electrical power produced by the power source 22 from one voltage, current, or temporal duration to another different voltage, current, or temporal duration.

According to some embodiments, a temporal duration for applying mechanical pressure to the piezo-electric elements 70 or stack 74 (e.g., by a pressing device) is a press duration, and the control circuit 24 outputs energy for a temporal output duration. The output duration can be less than the press duration. The output duration can be greater than the press duration. In some embodiments, an output duration is no less than one msec (e.g., no less than ten msecs, no less than 50 msecs, no less than 100 msecs, no less than 500 msecs, or no less than one second) (e.g., and no more than one minute). In some embodiments, an output duration can be temporally delayed from a press duration by at least one msec (e.g., at least ten msecs, at least 50 msecs, at least 100 msecs, at least 500 msecs, or at least one second) (e.g., and no more than one minute). By delaying an output, an observer who obscures a portion of a support substrate 10, for example with pressing device (e.g., a finger), in order to press a piezo-electric power source 22, has time to remove the pressing device so that the pressing device does not obscure light 60 output by a light-emitting module structure 99. An output duration can be selected to be long enough to be readily visible but short enough to reduce the amount of power used. A pressing device can be a finger or an object (e.g., a rigid object) sized and shaped to press a piezo-electric power source 22, for example.

The emitted light 60 travels (is conducted or transmitted) through the light conductor 30 and then emitted from the light-emitting module structure 99 at light-emitting locations 12, for example through openings, optical gaps, diffusers, or other light-leaking structures, so that an observer can observe the emitted light 60. Certain embodiments have the advantage that all of the electrical connections 26 are disposed only on the rigid module substrate 28 so that when the support substrate 10 is flexed, the rigid module substrate 28 resists the flexing and preserves the electrical connections 26 electrically connected to the iLED 50, the power source 22, and the control circuit 24. The light conductor 30 and the alignment of the light conductor 30 with the iLED 50 are less susceptible to damage from mechanical manipulation and the light conductor 30 can be more flexible than the micro-module 20. Because the iLED 50, the power source 22, and the control circuit 24 can be micro-transfer printed, as can the micro-module 20 itself, the micro-module 20 can be very small, for example having an area less than or equal to 250,000 square microns, 40,000 square microns, 10,000 square microns, 2,500 square microns, 1,000 square microns, 500 square microns, or 100 square microns. Because the micro-module 20 can be very small, the micro-module 20 is subject to reduced mechanical and environmental stress, for example when the support substrate 10 is folded or otherwise flexed. However, the light 60 emitted by the ILED 50 can be distributed over a wider area than the micro-module 20 and is therefore more readily visible because the emitted light 60 is transmitted through the light conductor 30. Because the light conductor 30 is more mechanically robust than the electrical connections 26, according to some embodiments, flexing the support substrate 10 does not necessarily prevent the emitted light 60 from entering and traveling through the light conductor 30 to the light diffuser or light leak at a light-emitting location 12. Thus, certain embodiments provide distributed light emission (over the support substrate 10) with only local electrical connections 26 (over the module substrate 28). This distributed light emission is more readily visible to an observer, particularly if the observer obscures a portion of the support substrate 10, for example with a finger.

Figure 12B:
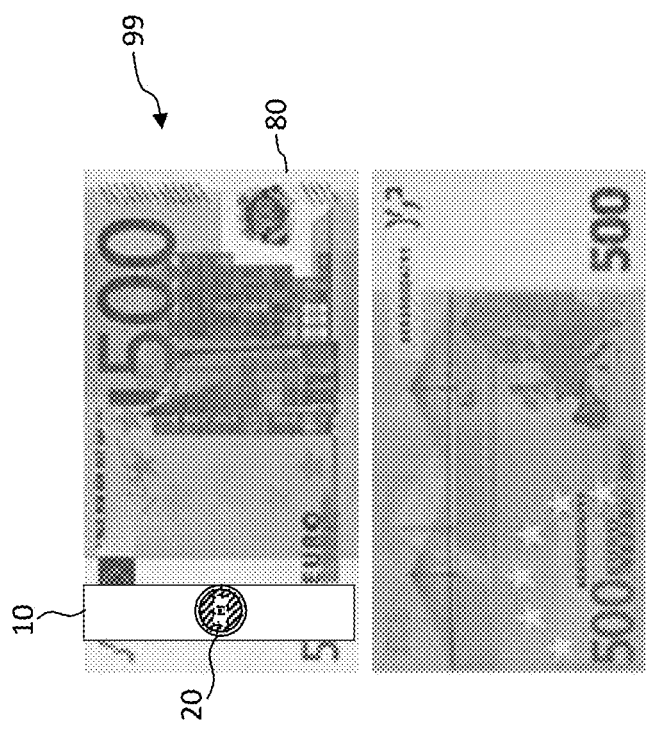
FIGS. 12A and 12B are each a top and bottom view of a bank note according to illustrative embodiments of the present disclosure.
Figure 12A:
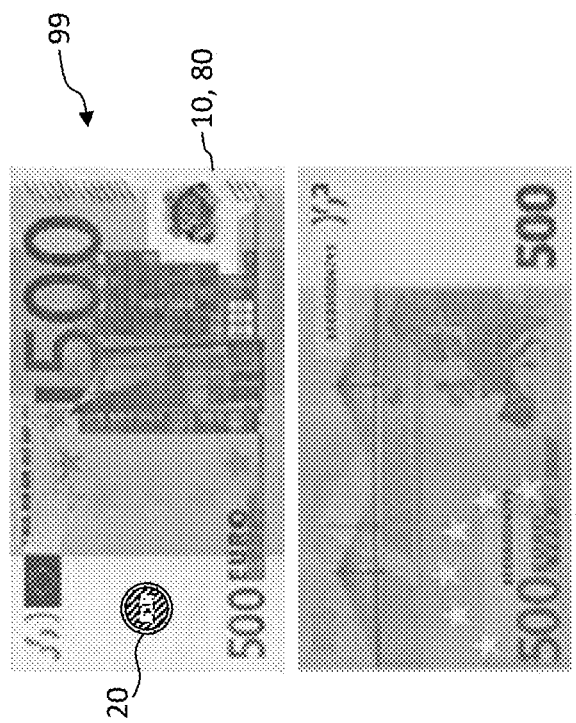
Figure 18:
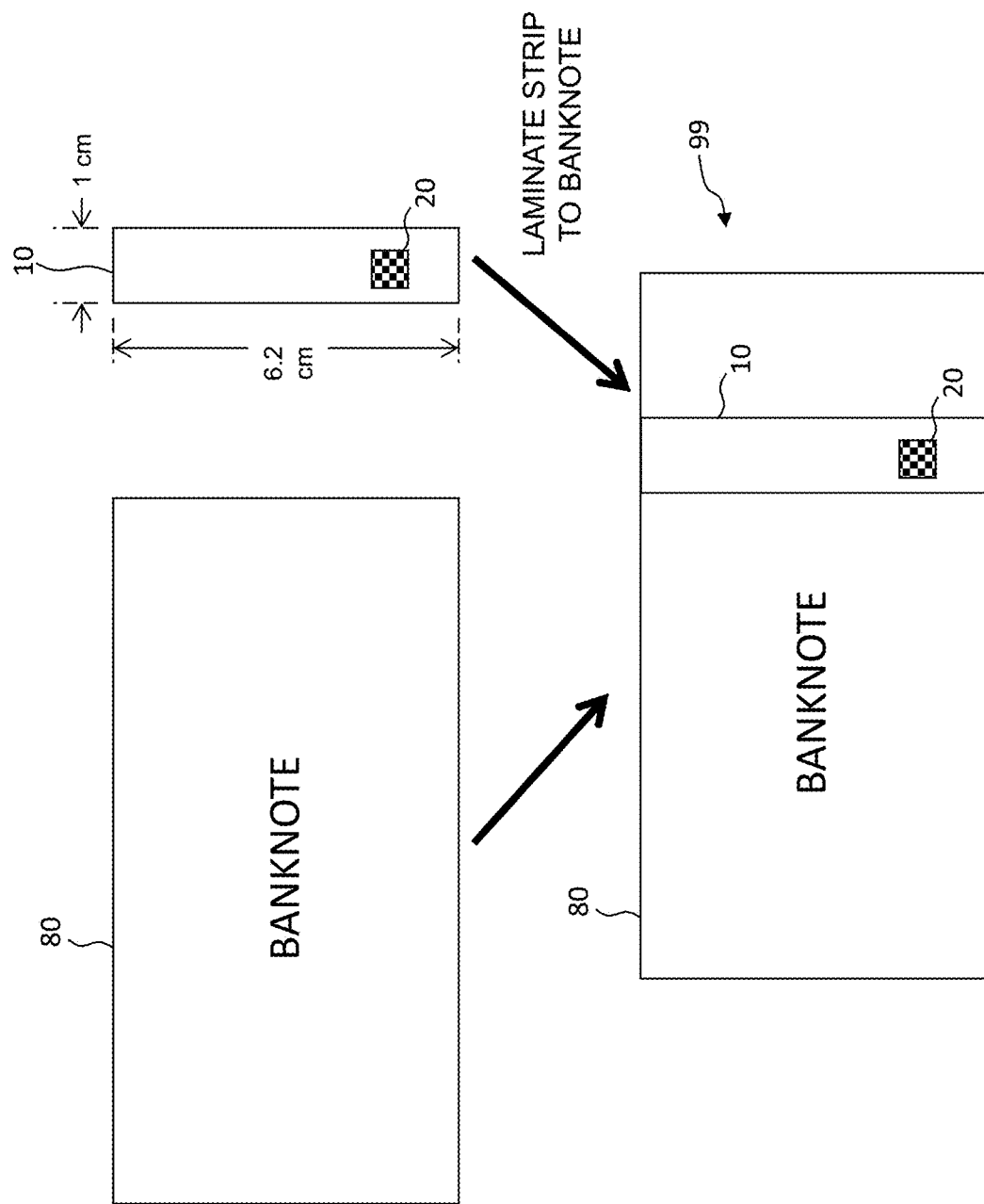
FIGS. 18 and 19 illustrate the assembly and use of a bank note in a plan view and perspective, respectively, in accordance with illustrative embodiments of the present disclosure.

Referring to FIG. 12A, in some embodiments, the support substrate 10 is a document substrate 80, for example a security or value document, or a substrate or layer in a security or value document, such as a banknote on which the micro-module 20 is disposed to make a light-emitting module structure 99 in accordance with some embodiments of the present disclosure. Referring to FIG. 12B and FIG. 18, in some embodiments, the support substrate 10 is a security strip comprising one or more micro-modules 20 that are disposed or embedded on or in, or woven into, or laminated to a document substrate 80, for example a security or value document, or a substrate or layer in a security or value document, such as a banknote to make the light-emitting module structure 99.

Figure 19:
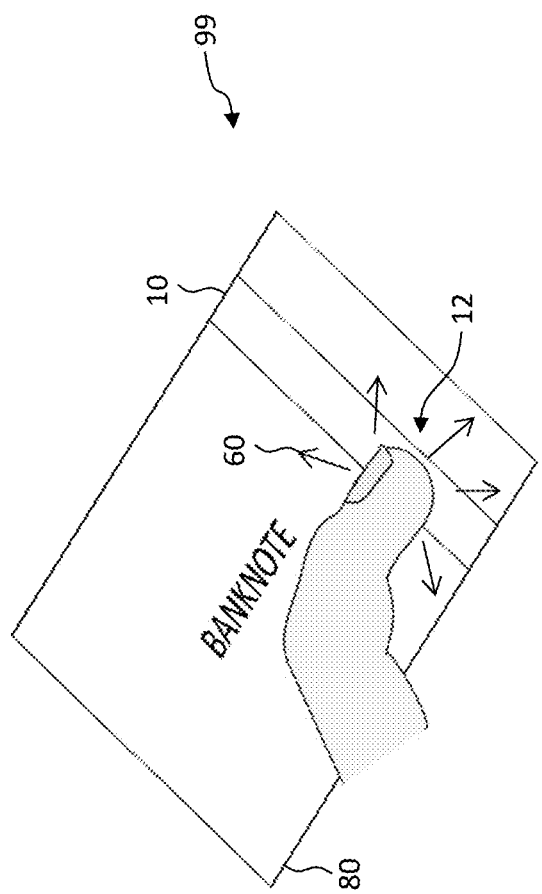

The support substrate 10 (or document substrate 80) can comprise optical structures such as diffusers, holograms, diffractive elements, lenses or other optical elements. The optical structures can be visible to an unaided human observer. In some embodiments, the optical structures are only visible with the assistance of equipment, such as microscopes or infrared or UV light sources or viewers. The iLED 50 can emit light 60 into the light conductor 30 and the light conductor 30 can transmit the emitted light 60 into the optical structure, for example to illuminate them to an observer, as shown in FIG. 19. In FIG. 19, a pressing device (in this example, a finger) presses on and obscures the micro-module 20 and the light conductor 30 (FIG. 1A) conducts the light 60 to light-emitting locations 12 away from the micro-module 20 that are not obscured by the finger.

Figure 13:
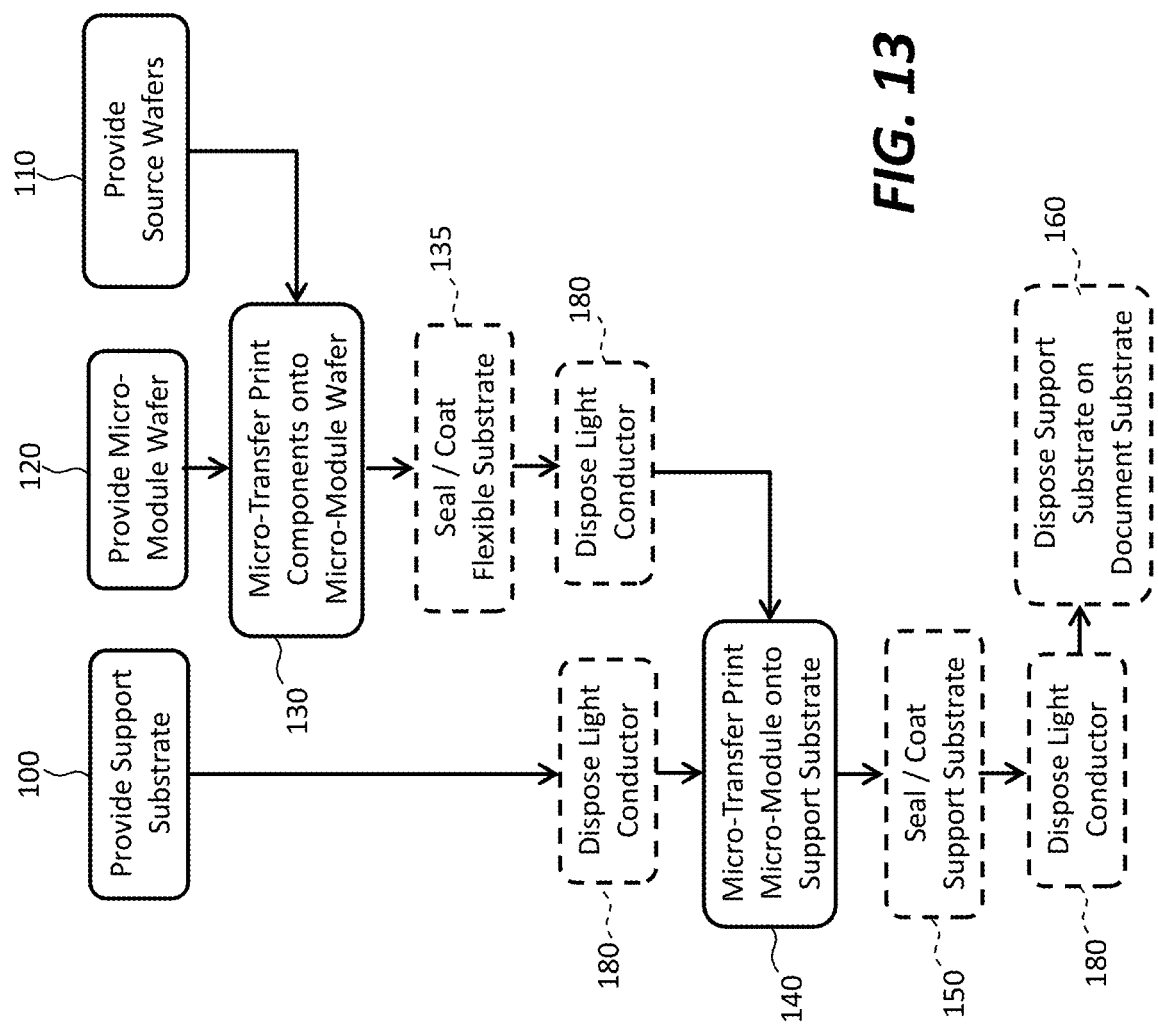
FIGS. 13-16 are flow diagrams according to illustrative methods of the present disclosure.
Figure 14:
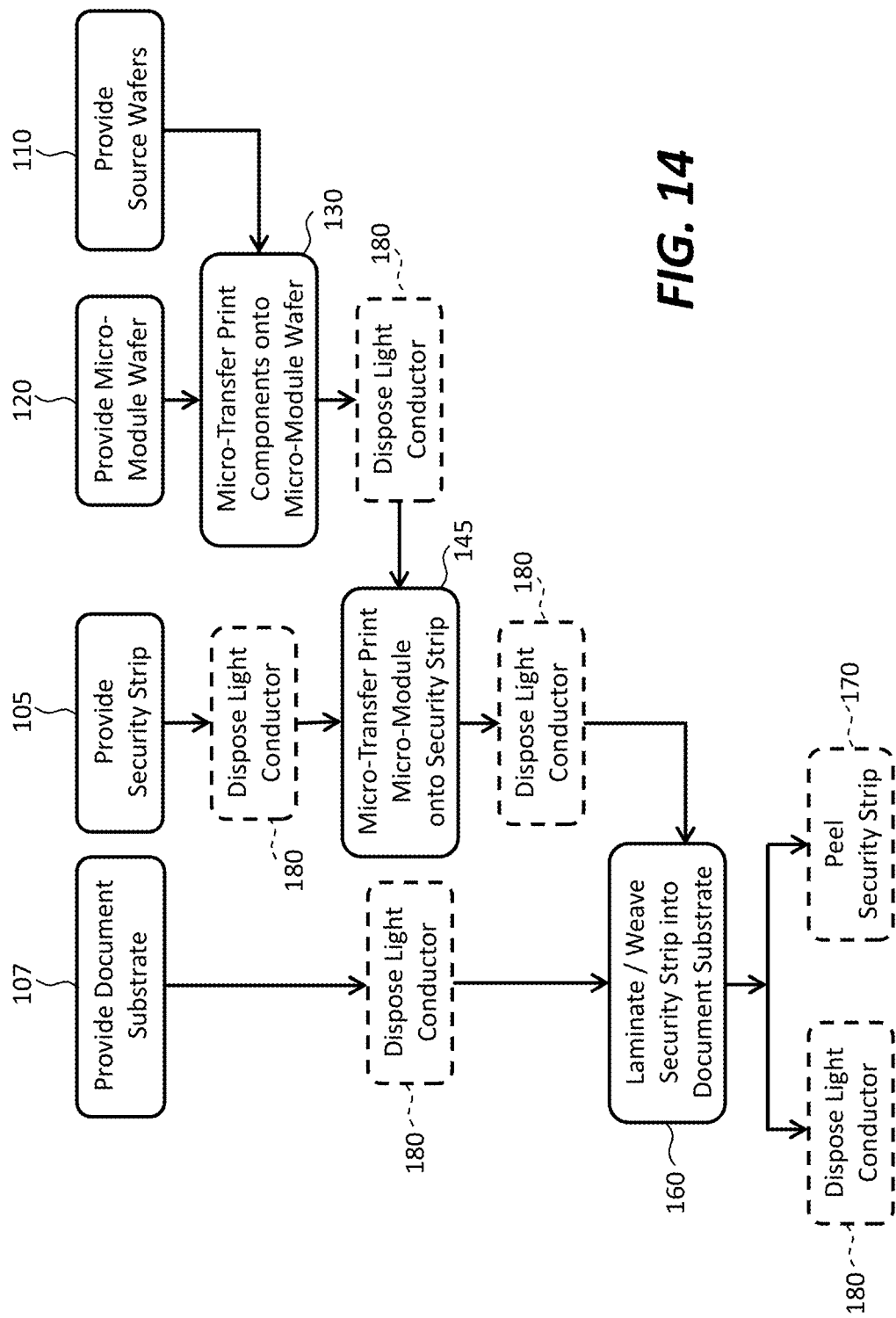
Figure 15:
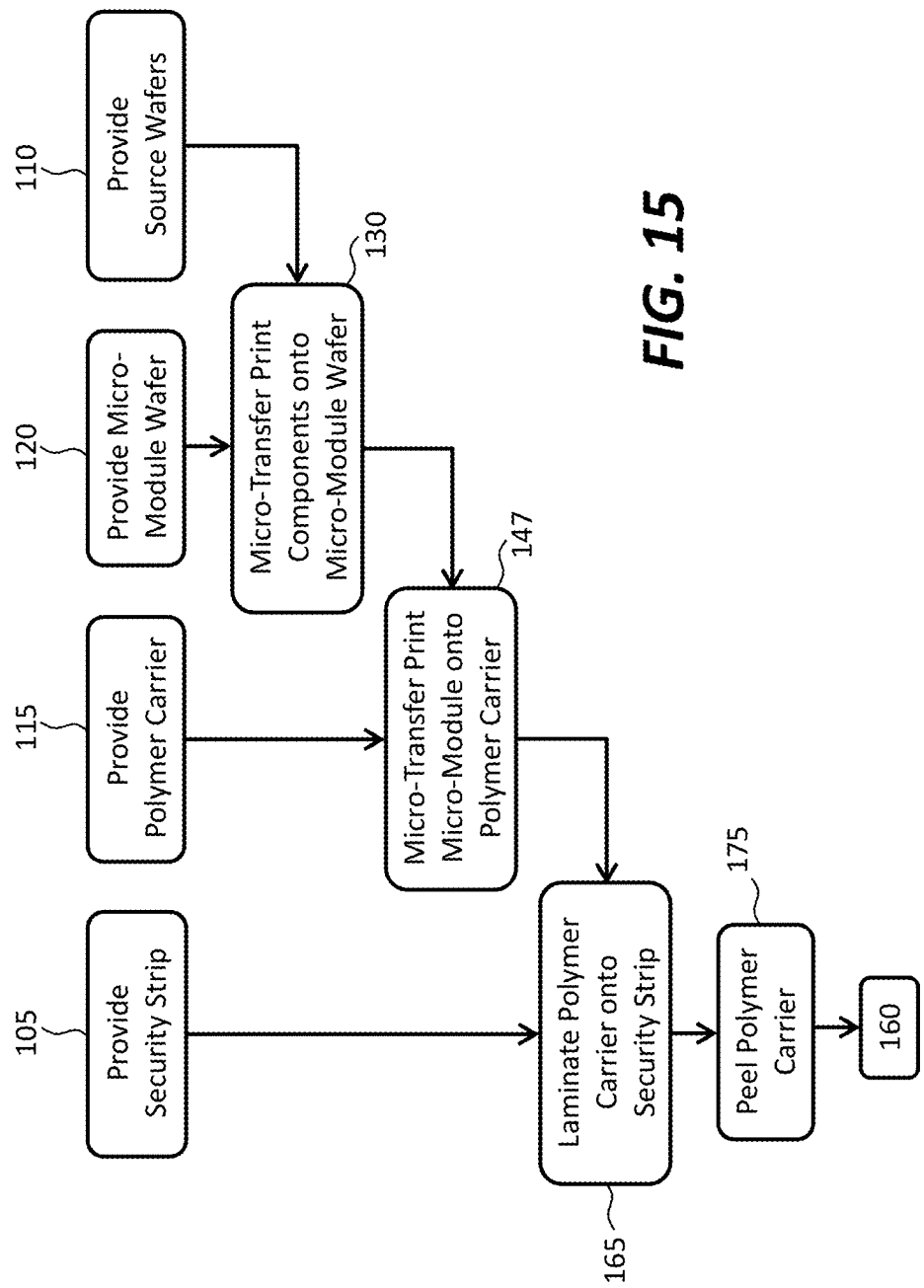

According to some embodiments, light-emitting module structures 99 such as those of FIG. 18, are constructed using methods illustrated in the flow diagrams of FIGS. 13-15. Referring to FIG. 13, a support substrate 10, such as a banknote or other value or security document having a document substrate 80 (equivalent to the support substrate 10 in this embodiment), is provided in step 100. Source wafers for one or more of the elements comprising the micro-module 20 are provided in step 110, for example source wafers having micro-transfer printable components such as iLEDs 50, integrated control circuits 24, or power sources 22 and a micro-module source wafer or source substrate is provided in step 120. The components are micro-transfer printed from the source wafers (or transferred from other source materials) onto the module substrate 28 or other source substrate of the micro-module source wafer in step 130. The module substrate 28 can be on a source wafer itself from which it can be micro-transfer printed or the module substrate 28 can be on another source substrate from which it can be transferred, for example using pick-and-place or surface-mount methods, tools, and materials. The micro-modules 20 can be processed to form electrical connections 26 electrically connecting the components after the components are transferred or the electrical connections 26 can be formed prior to disposing the components on the module substrate 28. Once the micro-module 20 is completed, it is optionally sealed or encapsulated for protection (step 135) and then transferred, for example by micro-transfer printing or other transfer methods, such as pick-and-place or surface-mount assembly techniques, to the support substrate 10 (step 140). The support substrate 10 can be sealed or coated or otherwise processed to encapsulate or protect the micro-modules 20 in step 150, as necessary.

In some embodiments such as those illustrated in FIG. 13, the support substrate 10 can be a document substrate 80 of a value or security document (e.g., a banknote or a component of a banknote such as a security strip as shown in FIG. 12A) or a component of a document substrate 80 (e.g., a security strip or thread as shown in FIGS. 12B and 18) that is subsequently disposed on a document substrate 80 (step 160). As shown in FIG. 13, the light conductor 30 can be disposed, applied, or formed in step 180 at any of a variety of steps in the process illustrated in FIG. 13, for example on or over the micro-module 20 and applied with the micro-module 20 to the support substrate 10, disposed on the support substrate 10 before the micro-module 20 is disposed on the support substrate 10, or disposed on the support substrate 10 after the micro-module 20 is disposed on the support substrate 10, and generally before or after any sealing, coating or encapsulating step (ordered arbitrarily in FIG. 13). If the support substrate 10 is a component in a document substrate 80 such as a banknote, the support substrate 10 can be applied, laminated, or woven into the document substrate 80 (step 160).

Referring to FIG. 14, an illustrative embodiment explicitly incorporating a security strip or thread as the support substrate 10 are illustrated. Referring to FIG. 14, a document substrate 80, such as a banknote or other value or security document having a document substrate 80, is provided in step 107. Security strips (which can be support substrates 10) are provided in step 105. Source wafers for one or more of the elements comprising the micro-module 20 are provided in step 110, for example source wafers having micro-transfer printable components such as iLEDs 50, integrated control circuit 24, or power sources 22 and a micro-module source wafer or source substrate is provided in step 120. The components are micro-transfer printed from the source wafers (or transferred from other source materials) onto the module substrate 28 or other source substrate of the micro-module source wafer in step 130. The module substrate 28 can be on a source wafer itself from which it can be micro-transfer printed or the module substrate 28 can be on another source substrate from which it can be transferred, for example using pick-and-place or surface-mount methods, tools, and materials. The micro-modules 20 can be processed to form electrical connections 26 electrically connecting the components after the components are transferred or the electrical connections 26 can be formed prior to disposing the components on the module substrate 28 (not shown in FIGS. 13-15, but can be considered to be a part of step 130). In some embodiments, the light conductor 30 can be provided (step 180) with the micro-module 20 before or after the components are transferred to the module substrate 28.

Once the micro-module 20 is completed, it is optionally sealed or encapsulated to protect it (FIG. 13, step 135) and then transferred, for example by micro-transfer printing or other transfer methods, such as pick-and-place or surface-mount assembly techniques, to the security strip (support substrate 10, step 145, equivalent to step 140 in FIG. 13). The security strip (support substrate 10) can be sealed or coated or otherwise processed to encapsulate or protect the micro-modules 20, as necessary (in step 150, shown in FIG. 13). In some embodiments, the light conductor 30 can be disposed on the micro-module 20 before or after the components are disposed on the micro-module substrate 28 (step 180). Once the security strip (support substrate 10) is completed, it is optionally sealed or encapsulated for protection (step 150, FIG. 13) and then transferred, for example by lamination or weaving, to the document substrate 80 (step 160). The document substrate 80 can be sealed or coated or otherwise processed to encapsulate or protect the micro-modules 20, as necessary. In some embodiments, the light conductor 30 can be disposed on the document substrate 80 before or after the security strip (support substrate 10) is disposed on the document substrate 80 (step 180).

In some embodiments, the security strip (support substrate 10) comprises a pressure-sensitive adhesive with a release liner and can be removed in step 170, e.g., by peeling, leaving the micro-module 20 and light conductor 30 behind on the document substrate 80, to form a structure similar to that of FIG. 12A. In some embodiments, the security strip (support substrate 10) remains, as shown in FIG. 12B.

The use of an adhesive tape with a release liner can be applied more generally in some embodiments of the present disclosure. Referring to FIG. 15, the component source wafers are provided in step 110 and micro-module wafers in step 120. The components are micro-transfer printed from the component source wafers to the module substrates 28 of the micro-module wafers in step 130. A polymer carrier (e.g., an adhesive tape with a release liner) is provided in step 115 and the micro-modules 20 transferred to the polymer carrier (e.g., by micro-transfer printing, pick-and-place methods, or surface-mount techniques) in step 147. The polymer carrier is then applied to the security strip (support substrate 10, or to a document substrate 80) in step 165, the micro-modules 20 are adhered to the security strip (support substrate 10), and the polymer carrier is removed in step 175. The security strip (support substrate 10) can then be integrated with the document substrate 80 in step 160.

Thus, in some embodiments, a method of disposing one or more micro-modules 20 on or in a support substrate 10 to provide a light-emitting module structure 99 comprises providing a micro-module source wafer comprising one or more individual (e.g., separate and independent) micro-modules 20, each micro-module 20 comprising a rigid module substrate 28, one or more inorganic light-emitting diodes 50, a power source 22, and a control circuit 24. The inorganic light-emitting diode 50, the power source 22, and the control circuit 24 are disposed on or in the module substrate 28 and the control circuit 24 receives power from the power source 22 to control the one or more inorganic light-emitting diodes 50 to emit light. If the support substrate 10 comprises a light conductor 30, one or more of the micro-modules 20 are disposed onto the support substrate 10, or else one or more of the micro-modules 20 are disposed onto the support substrate 10 and a light conductor 30 is disposed on the support substrate 10 or the micro-module 20, or both. The light conductor 30 is disposed in alignment with the one or more inorganic light-emitting diodes 50 so that the inorganic light-emitting diodes 50 emit light 60 into the light conductor 30 and the light conductor 30 conducts the light 60 beyond the micro-module 20 to emit the light 60 from any one or all of the light conductor 30, light-emitting module structure 99, or support substrate 10.

In some embodiments, the micro-module source wafer comprises one or more sacrificial portions. Each sacrificial portion is disposed between anchor portions of the micro-module source wafer, and each micro-module 20 is disposed completely over a sacrificial portion. One or more of the micro-modules 20 are disposed onto the support substrate 10 by micro-transfer printing one or more micro-modules 20 from the micro-module source wafer to the support substrate 10. Similarly, one or more inorganic light-emitting diode (iLED) source wafers comprise one or more sacrificial portions. Each sacrificial portion is disposed between anchor portions of the iLED source wafer, and each iLED 50 is disposed completely over a sacrificial portion. One or more of the iLEDs 50 are disposed onto the module substrate 28 by micro-transfer printing one or more iLEDs 50 from the iLED source wafer to the module substrate 28.

In some embodiments, the support substrate 10 is at least a portion of a security or value document (e.g., is a security or value document) or a layer on or in a security or value document or document substrate 80. In some embodiments, the support substrate 10 can be disposed onto or into a document substrate 80 that is at least a portion of a security or value document (e.g., is a security or value document) or a layer on or in a security or value document.

In methods in accordance with some embodiments, micro-modules 20 are adhered to the document substrate 80 and the support substrate 10 is removed. A polymer carrier can be provided and the micro-module 20 disposed on the polymer carrier and the polymer carrier disposed on the support substrate 10. The micro-module 20 can be adhered to the support substrate 10 and the polymer carrier removed or peeled from the support substrate 10. A sealing or encapsulation layer can be provided over the micro-module 20, provided over the micro-module 20 on the support substrate 10, provided over the polymer carrier, or provided over the document substrate 80.

The power source 22 can be a piezoelectric power source 22 or a photovoltaic power source 22 and the control circuit 24 can convert the power provided by the power source 22 to a form that is used by the iLEDs 50. The control circuit 24 can include power storage, for example using capacitors such as thin-film capacitors with a high-K dielectric to provide power over a time period. The capacitors can be distributed, for example located among a plurality of piezoelectric elements 70. Output diodes can be used to isolate the power source 22 or iLEDs 50. In one arrangement, the micro-modules 20 or light conductor 30 are indicated by visible markings on the support substrate 10 or document substrate 80 or form visible markings on the support substrate 10 or document substrate 80.

In some embodiments, the power source 22 comprises a plurality of electrically connected but physically separated individual power component, e.g., as piezo-electric elements 70. The piezo-electric elements 70 can be arranged in a 2-d array or a 1-d array and the power source 22 operated by squeezing, waving, or sliding an object across the power source 22. The power components can be a group of elements that are operated at the same time with a single action, for example pressure applied to all of the power components simultaneously (e.g., by a pressing device). The power components, e.g., piezo-electric elements 70, can be electrically arranged in series to achieve a desired voltage or in parallel to achieve a desired current or some combination of series and parallel to achieve the desired power characteristics.

The iLEDs 50 can be unpackaged micro-light-emitting diodes suitable for micro-transfer printing, for example made on a doped compound semiconductor wafer adapted to the manufacture of inorganic light-emitting diodes 50. The iLEDs 50 can be bare die.

The control circuit 24 can also be an integrated circuit, for example a small chiplet such as a bare die, suitable for micro-transfer printing. The control circuit 24 can be integrated into or on a semiconductor substrate such as a silicon substrate and can be provided as a bare die. The control circuit 24 can include digital circuits or logic (for example CMOS circuits) and power circuits (for example for driving an iLED 50). The control circuit 24 can include information storage circuits, a state machine, or a stored program machine to implement the desired functionality of the light-emitting module structure 99. The power source 22 can be directly connected to the control circuit 24 (as shown in FIG. 17) or to the iLEDs 50, or both. In some embodiments, the power source 22 can indirectly connect to the control circuit 24 or the iLEDs 50, or both through the electrical connections 26. The electrical connections 26 can be any patterned electrically conductive element, for example small wires, and can include power or circuit connection pads that, when electrically connected to a power source 22 provides power to the control circuit 24 and iLEDs 50 to enable them to function.

It can be desirable to fold or spindle a support substrate 10 in some embodiments without damaging the light-emitting module structure 99. To facilitate such manipulation without damage, in some embodiments, the power source 22, iLED 50, and control circuit 24 are small, for example having dimensions less than 50 microns, 20 microns, or ten microns, and the micro-module 20 is also small, for example having dimensions less than 500 microns, 250 microns, 100 microns, 50 microns, or 20 microns. Although the module substrate 28 is relatively rigid, because it is small and incorporated within a flexible and somewhat compliant support substrate 10, the support substrate 10 can bend without breaking the micro-module 20 or light conductor 30.

In some embodiments, the iLEDs 50 and micro-module 20 are too small to be readily visible with the unaided human eye. Furthermore, the iLEDs 50 and control circuit 24 can be located in areas of the support substrate 10 that include visible markings to further obscure the presence of the iLEDs 50, light conductor 30, and micro-module 20. The support substrate 10 can be marked, for example by printing on a high-quality paper with ink using intaglio printing.

Similarly, the power source 22 or an arrangement of individual smaller power piezo-electric elements 70 can be obscured by the visible markings. In one embodiment, the micro-module 20 or light conductor 30 is marked with visible markings. For example, ink can be printed over the light conductor 30 or micro-module 20 or any of its components to obscure them or otherwise make them a part of the visible markings on the support substrate 10 (e.g., a banknote).

Since the micro-module 20 and any of its components, e.g., iLEDs 50, control circuit 24, electrical connections 26 (wires), power source 22, can each be very small, for example having a size in the micron range, they can be effectively invisible to the unaided human eye. For example, the one or more inorganic micro light-emitting diodes 50 or the control circuit 24 of the light-emitting module structure 99 can have a width from 2 to 50 µm (e.g., 2 to 5 µm, 5 to 10 µm, 10 to 20 µm, or 20 to 50 µm, a length from 2 to 50 µm (e.g., 2 to 5 µm, 5 to 10 µm, 10 to 20 µm, or 20 to 50 µm), and/or a height from 2 to 50 µm (e.g., 2 to 5 µm, 5 to 10 µm, 10 to 20 µm, or 20 to 50 µm).

In some embodiments, the support substrate 10, security strips, or threads can include a metalized or metallic ribbon or thread, for example Mylar. The support substrate 10 can have one or more optical structures disposed in a pattern. The support substrate 10 can comprise paper, such as cotton paper, plastic-coated paper, or plastic-impregnated paper. The polymer carrier can be a plastic, polymer, or resin sheet or substrate, for example having a thickness of no more than 250 microns, no more than 100 microns, no more than 50 microns, or no more than 20 microns or less.

The light conductor 30 can comprise waveguides, light pipes 44, or optical fibers and can include optical structures include lenses, refractive, or diffractive optical elements, for example comprising glass, plastic, or polymer materials, as well as more rigid materials such as silicon oxides or nitrides. The reflectors 40, 42, can be evaporated or laminated metal layers, for example aluminum, silver, gold, tin, or other reflective metals or metal alloys, or other reflective materials. The light conductor 30 can be more flexible than the micro-modules 20 and less or equally flexible as the support substrate 10 or document substrate 80.

In some embodiments, one or more light pipes 44 are located in association with the one or more inorganic light-emitting diodes 50 to transmit light 60 emitted by the inorganic light-emitting diodes 50 through the light pipes 44 and emit the transmitted light 60 from the opposite end of the light pipe 44 at a light-emitting location 12 remote from the micro-module 20 and iLED 50. In some embodiments, the light pipes 44 include portions that leak light 60 at desired locations, for example by purposefully forming nicks, scratches, or other forms of light diffusers in the light pipes 44 to allow light 60 to leak from the light pipe 44. Thus, the arrangement of the light pipes 44 can also correspond to a portion of the visible markings of the support substrate 10 to highlight or otherwise indicate the portion of the visible markings, form a graphic indicator, or form any one or all of a number, a letter, and a pictogram to indicate a value, a date, or a person.

The control circuit 24 can control the one or more inorganic light-emitting diodes 50 to flash or sequentially flash individual iLEDs 50, forming spatial, temporal, or temporal-spatial light patterns. If the light-emitting module structure 99 comprises multiple iLEDs 50, the iLEDs 50 can emit different colors of light. For example, a red light-emitting diode 50 can emit red light, a green light-emitting diode 50 can emit green light, and a blue light-emitting diode 50 can emit blue light. The different inorganic light-emitting diodes 50 can be arranged spatially to form a display, a two-dimensional array, or a graphic element.

Components on a source wafer are released from the source wafer by etching away a sacrificial portion, leaving the components suspended over the sacrificial portion and connected to an anchor portion by the tether. Components are micro-transfer printed from a source wafer onto the module substrate 28 using a stamp to fracture the tethers connecting the components to the source wafer leaving at least a tether portion 90 on the components (shown in FIG. 1A).

A light-emitting module structure 99 in accordance with some embodiments can be used by first receiving the light-emitting module structure 99, providing power to the control circuit 24 from the power source 22, for example by mechanically pressing, squeezing, or stretching the piezo-electric structure, exposing the solar cell to light, or providing electromagnetic radiation to the antenna, and using the control circuit 24 to cause the iLEDs 50 to emit light 60 into the light conductor 30 and out of the light-emitting locations 12, and viewing the emitted light. Mechanical manipulation can be done by hand, for example with one or more fingers.

As shown in FIG. 19, in accordance with some embodiments, a light-emitting module structure 99 having a piezo-electric power source 22 can be pressed or squeezed, for example, by a finger, to provide power to iLEDs 50, causing the iLEDs 50 to emit light. Power is provided both when pressing and releasing. It has been demonstrated that a fingertip having a one square cm area can provide a force of 35 N. Even with a smaller force of 10 N, a piezoelectric power source 22 with a total area of 0.06 cm$^2$ provides sufficient power to operate a piezoelectric according to some embodiments, including digital control for iLED 50 sequencing, for example flashing. With larger forces, functional light-emitting module structure 99 can have an area less than 25,000 square microns.

U.S. patent application Ser. No. 14/743,981, filed Jun. 18, 2015, entitled "Micro Assembled Micro LED Displays and Lighting Elements", incorporated herein by reference describes micro-transfer printing structures and processes useful in certain embodiments of the present disclosure. For a discussion of micro-transfer printing techniques see also U.S. Pat. Nos. 8,722,458, 7,622,367 and 8,506,867, each of which is hereby incorporated by reference in its entirety. Micro-transfer printing using compound micro assembly structures and methods can also be used in certain embodiments, particularly for micro-modules 20, and for example as described in U.S. patent application Ser. No. 14/822,868, filed Aug. 10, 2015, entitled "Compound Micro-Assembly Strategies and Devices", which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in various embodiments of the present disclosure. For example, a first layer on a second layer in some embodiments means a first layer directly on and in contact with a second layer. In some embodiments, a first layer on a second layer can include another layer there between.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. Certain embodiments have been described in particular detail above, but it is understood that variations and modifications can be effected within the spirit and scope of the invention.

PARTS LIST 10 support substrate
12 light-emitting location
20 micro-module
22 power source
24 control circuit
26 electrical connections
28 module substrate
30 light conductor
32 light-transmissive layer/transparent layer
40 reflector/reflective layer
42 reflector/reflective layer
44 light pipe
46 reflector/reflective layer
50 inorganic light-emitting diode (iLED)
60 emitted light
70 piezo-electric element
72 electrical conductor
74 stack of piezo-electric elements
76 piezo-electric device
80 document substrate
90 tether portion/separated tether
99 light-emitting module structure
100 provide flexible substrate step
105 provide security strip step
107 provide document substrate step
110 provide source wafers step
115 provide polymer carrier step
120 provide micro-module wafer step
130 micro-transfer print components onto micro-module wafer step
135 optional seal/coat step
140 micro-transfer micro-modules onto support substrate step
145 micro-transfer print micro-module onto security strip step
147 micro-transfer print micro-module onto polymer carrier step
150 optional seal/coat step
160 dispose support substrate into document substrate step
165 laminate polymer carrier on security strip step
170 optional peel security strip step
175 peel polymer carrier step
180 optional dispose light conductor step
200 provide piezo-electric element source wafer
210 provide piezo-electric element on substrate step
220 micro-transfer print piezo-electric element from source wafer onto piezo-electric element on substrate step
230 dispose electrical conductor onto piezo-electric element step
240 optional heat electrical conductors step
250 optional cool electrical conductors step
260 transfer power source to module substrate step

What is claimed is:

1. A light-emitting module structure, comprising:
   a support substrate;
   a micro-module disposed on or in the support substrate and extending over only a portion of the support substrate, the micro-module comprising:
      a rigid module substrate separate from the support substrate, an inorganic light-emitting diode, a power source, and a control circuit,
      wherein the inorganic light-emitting diode, the power source, and the control circuit are each disposed on or in the module substrate, and wherein the control circuit, the power source, and the inorganic light-emitting diode are electrically connected such that the control circuit receives power from the power source to control the inorganic light-emitting diode to emit light, the inorganic light-emitting diode comprising a substrate separate from the module substrate and the support substrate; and
   a light conductor disposed on or in the support substrate and in alignment with the micro-module such that the inorganic light-emitting diode is disposed to emit light into the light conductor and the light conductor conducts the light beyond the micro-module to emit the light from the light conductor to a location on the support substrate remote from the micro-module.

2. The light-emitting module structure of claim 1, wherein the module substrate is a semiconductor substrate and the control circuit is formed at least partially in the module substrate.

3. The light-emitting module structure of claim 1, wherein at least one of (i) the control circuit is a micro-transfer printed integrated circuit comprising a circuit substrate separate from the module substrate and the support substrate and at least a portion of a fractured or separated tether, (ii) the inorganic light-emitting diode is a micro-transfer printed inorganic light-emitting diode (iLED) comprising an iLED substrate separate from the module substrate and the support substrate and at least a portion of a fractured or separated tether, and (iii) the power source is a micro-transfer printed power source comprising a power source substrate separate from the module and support substrates and at least a portion of a fractured or separated tether.

4. The light-emitting module structure of claim 1, wherein the power source comprises a solar cell, a piezo-electric structure, or an antenna.

5. The light-emitting module structure of claim 1, wherein the power source comprises a stack of piezo-electric elements, wherein the piezo-electric elements of the stack are electrically connected in serial.

6. The light-emitting module structure of claim 1, wherein the micro-module comprises an electrical interconnection circuit that electrically interconnects the power source, the control circuit, and the inorganic light-emitting diode.

7. The light-emitting module structure of claim 1, wherein the light conductor comprises a reflector and a transparent layer, wherein the transparent layer is disposed adjacent to the reflector in a direction orthogonal to the support substrate.

8. The light-emitting module structure of claim 1, wherein the light conductor comprises two reflectors and the transparent layer is disposed between two reflectors.

9. The light-emitting module structure of claim 1, wherein the light conductor comprises a reflector and (i) the reflector is disposed on the support substrate between the support substrate and the micro-module, (ii) the reflector is disposed on the support substrate so that the support substrate is between the reflector and the micro-module, or (iii) the micro-module is disposed between the support substrate and the reflector.

10. The light-emitting module structure of claim 1, wherein the light conductor comprises one or more light pipes that each receive light from the inorganic light-emitting diode.

11. The light-emitting module structure of claim 1, wherein the light conductor comprises at least one of one or more diffusers, one or more light leaks, and one or more optical gaps disposed beyond the micro-module at a location on the support substrate remote from the micro-module.

12. The light-emitting module structure of claim 1, wherein the light conductor extends over only a portion of the support substrate providing optical gaps at the extremity of the light conductor.

13. The light-emitting module structure of claim 1, wherein the inorganic light-emitting diode is disposed such that the inorganic light-emitting diode emits light through the module substrate.

14. The light-emitting module structure of claim 1, wherein the inorganic light-emitting diode primarily emits light in a direction away from the module substrate.

15. The light-emitting module structure of claim 1, wherein the inorganic light-emitting diode is disposed between the module substrate and the support substrate.

16. The light-emitting module structure of claim 1, wherein the module substrate is disposed between the inorganic light-emitting diode and the support substrate.

17. The light-emitting module structure of claim 1, wherein the support substrate is flexible.

18. The light-emitting module structure of claim 1, wherein the support substrate is a security strip.

19. The light-emitting module structure of claim 1, wherein the inorganic light-emitting diode, the power source, and the control circuit are each disposed on or in a same side of the module substrate.

20. The light-emitting module structure of claim 18, comprising a security or value document, wherein the security strip is disposed on or in the security or value document.

* * * * *